(12) United States Patent
Han et al.

(10) Patent No.: US 12,696,646 B2
(45) Date of Patent: Jul. 28, 2026

(54) DISPLAY PANEL AND DISPLAY DEVICE

(71) Applicants: WUHAN TIANMA MICRO-ELECTRONICS CO., LTD., Wuhan (CN); Wuhan Tianma Microelectronics Co., Ltd. Shanghai Branch, Shanghai (CN)

(72) Inventors: Bing Han, Wuhan (CN); Gaojun Huang, Wuhan (CN); Yu Xin, Wuahn (CN)

(73) Assignees: WUHAN TIANMA MICRO-ELECTRONICS CO., LTD., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 570 days.

(21) Appl. No.: 18/297,823

(22) Filed: Apr. 10, 2023

(65) Prior Publication Data

US 2023/0247882 A1 Aug. 3, 2023

(30) Foreign Application Priority Data

Nov. 24, 2022 (CN) .......................... 202211496600.2

(51) Int. Cl.
H10K 59/35 (2023.01)
H10K 71/16 (2023.01)

(52) U.S. Cl.
CPC ......... H10K 59/352 (2023.02); H10K 59/353 (2023.02); H10K 71/166 (2023.02)

(58) Field of Classification Search
CPC ........................... H10K 59/352; H10K 59/353
See application file for complete search history.

(56) References Cited

U.S. PATENT DOCUMENTS

| | | | | |
|---|---|---|---|---|
| 8,569,947 B2* | 10/2013 | Jeon | ...................... | H10K 59/352 |
| | | | | 313/503 |
| 2022/0069027 A1* | 3/2022 | Wang | ................... | H10K 59/352 |
| 2022/0069031 A1* | 3/2022 | Yue | ...................... | H10K 59/352 |
| 2022/0208891 A1* | 6/2022 | Liu | ...................... | H10K 59/353 |

FOREIGN PATENT DOCUMENTS

| | | |
|---|---|---|
| CN | 103515411 A | 1/2014 |
| CN | 206322697 U | 7/2017 |
| CN | 107742638 A | 2/2018 |
| CN | 110335892 A | 10/2019 |
| CN | 110556074 A | 12/2019 |
| CN | 210926019 U | 7/2020 |

OTHER PUBLICATIONS

First Chinese Office Action mailed on May 22, 2025, issued in Chinese Application No. 202211496600.2; 17 pages.

* cited by examiner

*Primary Examiner* — Mariceli Santiago
(74) *Attorney, Agent, or Firm* — CHRISTENSEN O'CONNOR JOHNSON KINDNESS PLLC

(57) ABSTRACT

A display panel and a display device are provided. The display panel includes first color sub-pixels, second color sub-pixels, and third color sub-pixels. The first color sub-pixel is surrounded by a first safe region, the second color sub-pixel is surrounded by a second safe region, and the third color sub-pixel is surrounded by a third safe region. None of the first color sub-pixels, the second color sub-pixels, and the third color sub-pixels is provided in each of the first safe regions, the second safe regions and the third safe regions. The first safe region, the second safe region, and the third safe region have three different areas, respectively.

20 Claims, 11 Drawing Sheets

01

DISPLAY PANEL AND DISPLAY DEVICE

CROSS-REFERENCE TO RELATED APPLICATIONS

The present application claims priority to Chinese Patent Application No. 202211496600.2, filed on Nov. 24, 2022, the content of which is incorporated herein by reference in its entirety.

TECHNICAL FIELD

The present disclosure relates to the field of display technology, and in particular, to a display panel and a display device.

BACKGROUND

An organic light-emitting diode (OLED) has display characteristics, such as self-luminescence, a large viewing angle, a wide color gamut, short response time, and a high contrast ratio. Moreover, OLEDs have advantages of being light and thin, and, thus, can be used for flexible displays. Therefore, OLEDs have become the third-generation display technology following the liquid crystal display. However, as the demand for the resolution of the display panel increases, the number of sub-pixels in the display panel also increases accordingly to display with high resolution. As such, there is a risk of color-cross between sub-pixels of different colors.

SUMMARY

In a first aspect, an embodiment of the present disclosure provides a display panel. The display panel includes first color sub-pixels, second color sub-pixels, and third color sub-pixels. The first color sub-pixel is surrounded by a first safe region, the second color sub-pixel is surrounded by a second safe region, and the third color sub-pixel is surrounded by a third safe region. None of the first color sub-pixels, the second color sub-pixels, and the third color sub-pixels is provided in each of the first safe regions, the second safe regions and the third safe regions. The first safe region, the second safe region, and the third safe region have three different areas, respectively.

In a second aspect, an embodiment of the present disclosure provides a display device including a display panel. The display panel includes first color sub-pixels, second color sub-pixels, and third color sub-pixels. The first color sub-pixel is surrounded by a first safe region, the second color sub-pixel is surrounded by a second safe region, and the third color sub-pixel is surrounded by a third safe region. None of the first color sub-pixels, the second color sub-pixels, and the third color sub-pixels is provided in each of the first safe regions, the second safe regions and the third safe regions. The first safe region, the second safe region, and the third safe region have three different areas, respectively.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there can be three relationships, for example, A and/or B can indicate that three cases, i.e., A alone, A and B, B alone. The character "/" herein generally indicates that the related objects before and after the character form an "or" relationship.

In the description of the specification of the present disclosure, it should be understood that a term such as "substantially", "about", "approximately", and "roughly" described in the claims and embodiments of the present disclosure refers to a value that is generally acceptable within a reasonable process operating range or tolerance range, rather than an exact value.

It should be understood that, although the safe region/the sub-pixel can be described using the terms of "first", "second", "third", etc., in the embodiments of the present disclosure, the safe region/the sub-pixel will not be limited to these terms. These terms are merely used to distinguish safe regions/sub-pixels from one another. For example, without departing from the scope of the embodiments of the present disclosure, a first safe region/a first sub-pixel can also be referred to as a second safe region/a second sub-pixel, similarly, a second safe region/a second sub-pixel can also be referred to as a first safe region/a first sub-pixel.

Figure 1:
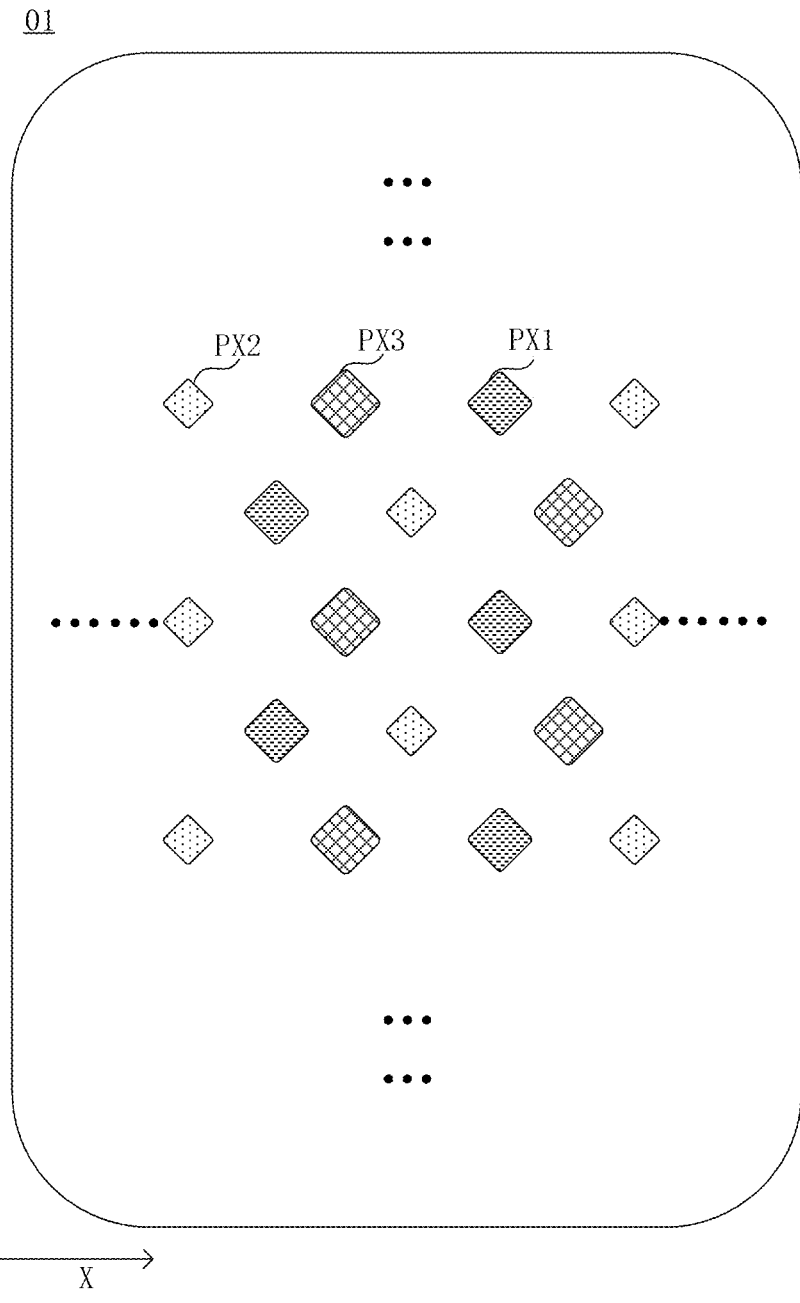
FIG. 1 is a schematic diagram of a display panel according to some embodiments of the present disclosure.
Figure 2:
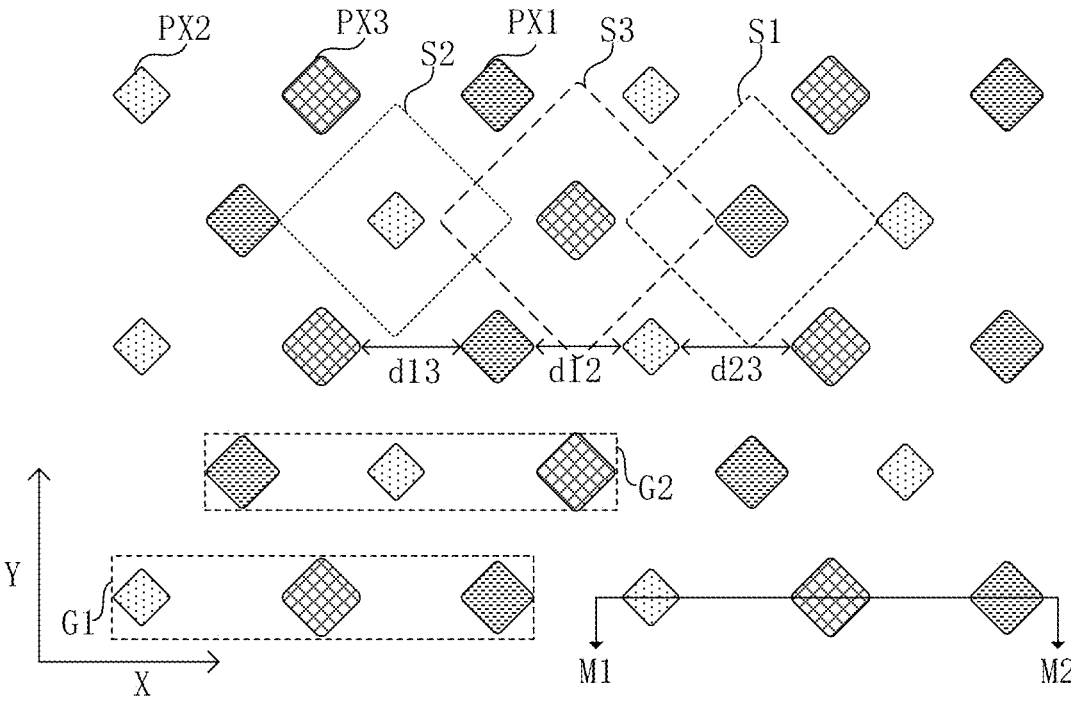
FIG. 2 is a schematic diagram of an arrangement of sub-pixels in a display panel according to some embodiments of the present disclosure.

FIG. 1 is a schematic diagram of a display panel according to some embodiments of the present disclosure. FIG. 2 is a schematic diagram of an arrangement of sub-pixels in a display panel according to some embodiments of the present disclosure.

As shown in FIG. 1 and FIG. 2, the display panel 01 includes multiple sub-pixels, and the multiple sub-pixels include multiple first color sub-pixels PX1, multiple second color sub-pixels PX2, and multiple third color sub-pixels PX3. The first color sub-pixel PX1, the second color sub-pixel PX2 and the third color sub-pixel PX3 are sub-pixels of different colors. For example, the first color sub-pixel PX1, the second color sub-pixel PX2, and the third color sub-pixel PX3 are a red sub-pixel, a green sub-pixel, and a blue sub-pixel, respectively.

With reference to FIG. 2, the display panel 01 has multiple safe regions. The multiple safe regions include a first safe region S1, a second safe region S2 and a third safe region S3. The first safe regions S1 can be in one-to-one correspondence with the first color sub-pixels PX1, the second safe regions S2 can be in one-to-one correspondence with the second color sub-pixels PX2, and the third safe regions S3 can be in one-to-one correspondence with the third color sub-pixels PX3. For example, in FIG. 2, a dotted-line box surrounding the sub-pixel of each color represents a safe region corresponding to the sub-pixel of this color. The first safe region S1 surrounds the first color sub-pixel PX1, and no sub-pixel is arranged in the first safe region S1; the second safe region S2 surrounds the second color sub-pixel PX2, and no sub-pixel is arranged in the second safe region S2; and the third safe region S3 surrounds the third color sub-pixel PX3, and no sub-pixel is arranged in the third safe region S3.

That is, neither the second color sub-pixel PX2 nor the third color sub-pixel PX3 is arranged in a certain region surrounding the first color sub-pixel PX1, and this certain region is the first safe region S1; neither the first color sub-pixel PX1 nor the third color sub-pixel PX3 is arranged in a certain region surrounding the sub-pixel PX2, and this certain region is the second safe region S2; and neither the first color sub-pixel PX11 nor the second color sub-pixel PX2 is arranged in a certain region surrounding the third color sub-pixel PX3, and this certain region is the third safe region S3.

In the embodiments of the present disclosure, the first safe region S1, the second safe region S2 and the third safe region S3 have three different areas, respectively. For example, the first safe region S1 has an area A1, the second safe region S2 has an area A2, and the third safe region S3 has an area A3, where A1≠A2, A2≠A3, and A1≠A3. That is, a region surrounding the first color sub-pixel PX1 where neither the second color sub-pixel PX2 nor the third color sub-pixel PX3 is arranged has an area A1, a region surrounding the second color sub-pixel PX2 where neither the first color sub-pixel PX1 nor the third color sub-pixel PX3 is arranged has an area A2, and a region surrounding the third color sub-pixel PX3 where neither the first color sub-pixel PX1 nor the second color sub-pixel PX2 is arranged has an area A3, where A1≠A2, A2≠A3, and A1≠A3.

Figure 3:
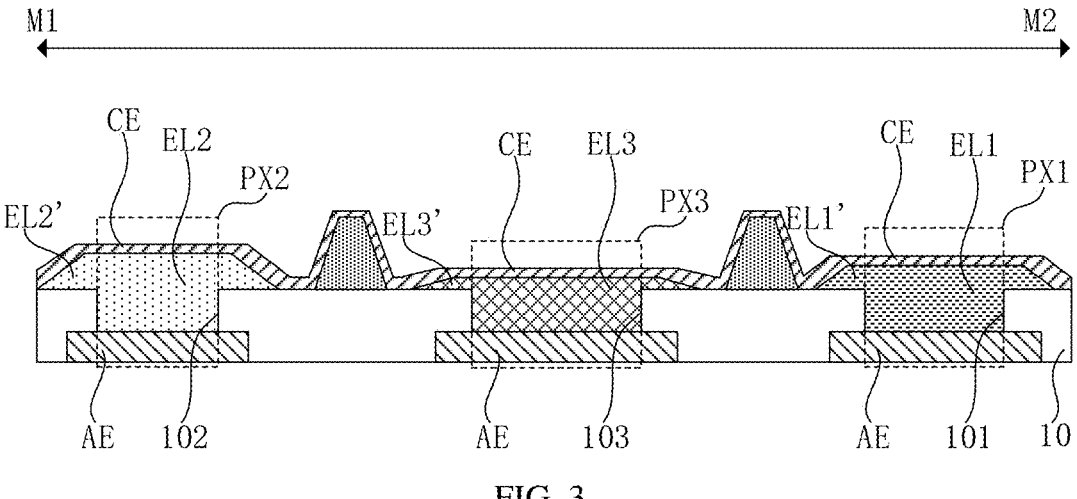
FIG. 3 is a cross-sectional view along line M1-M2 shown in FIG. 1 according to an embodiment of the present disclosure.

FIG. 3 is a cross-sectional view along line M1-M2 shown in FIG. 1.

In some embodiments of the present disclosure, the first color sub-pixel, the second color sub-pixel, and the third color sub-pixel each can include a light-emitting material layer, which is a material layer of the sub-pixel configured to emit light. For example, the light-emitting material layer can be an organic light-emitting material layer. The display panel 01 in the embodiments of the present disclosure can be an organic light-emitting display panel, and the light-emitting material layers of the first color sub-pixel, the second color sub-pixel, and the third color sub-pixel can be organic light-emitting material layers that can emit light of different color.

The first color sub-pixel, the second color sub-pixel, and the third color sub-pixel each sub-pixel each can include an anode AE and a cathode CE, and the light-emitting material layer is located between the anode AE and the cathode CE. The anode AE and the cathode CE drive the light-emitting material layer that is located between the anode AE and the cathode CE to emit light. The first color sub-pixel, the second color sub-pixel, and the third color sub-pixel each can include an electron transport layer, a hole transport layer, an electron injection layer, a hole injection layer, and the like. The cathodes CE of different sub-pixels can be electrically connected to each other, and the anode AE of the first color sub-pixel, the anode AE of the second color sub-pixel, and the anode AE of the third color sub-pixel each can be electrically connected to corresponding pixel circuits, respectively.

As shown in FIG. 3, the first color sub-pixel PX1 includes a first color light-emitting material layer EL1, the second color sub-pixel PX2 includes a second color light-emitting material layer EL2, and the third color sub-pixel PX3 includes a third color light-emitting material layer EL3. The first color light-emitting material layer EL1 is located between the cathode CE and the anode AE of the first color sub-pixel PX1 and is configured to emit first color light under driving of the cathode CE and the anode AE of the first color sub-pixel PX1. The second color light-emitting material layer EL2 is located between the cathode CE and the anode AE of the second color sub-pixel PX1 and is configured to emit second color light under driving of the cathode CE and the anode AE of the second color sub-pixel PX2. The third color light-emitting material layer EL3 is located between the cathode CE and the anode AE of the third color sub-pixel PX3, and is configured to emit third color light under driving of the cathode CE and the anode AE of the third color sub-pixel PX3.

At least part of the light-emitting material layer is located in an opening of a pixel definition layer 10. The opening of the pixel definition layer defines a light-emitting area of the sub-pixel. That is, a region of the sub-pixel can be defined by a region where an upper surface of the opening of the pixel definition layer 10 is located. As shown in FIG. 3, the first color light-emitting material layer EL1 is located in a first opening 101 of the pixel definition layer 10, and the first opening 101 defines a region where the first color sub-pixel PX1 is located; the second color light-emitting material layer EL2 is located in a second opening 102 of the pixel definition layer 10, and the second opening 102 defines a region where the second color sub-pixel PX2 is located; and the third color light-emitting material layer EL3 is located in a third opening 103 of the pixel definition layer 10, and the third opening 103 defines a region where the third color sub-pixel PX3 is located. Correspondingly, a distance between sub-pixels of different colors (the first color sub-pixel PX1, the second color sub-pixel PX2, and the third color sub-pixel PX3) can be regarded as a distance between openings of the pixel definition layers 10 of the sub-pixels.

The light-emitting material layer can be prepared by adopting an evaporation process where a mask plate is used. The following takes the preparation of the first color light-emitting material layer EL1 as an example.

Figure 4:
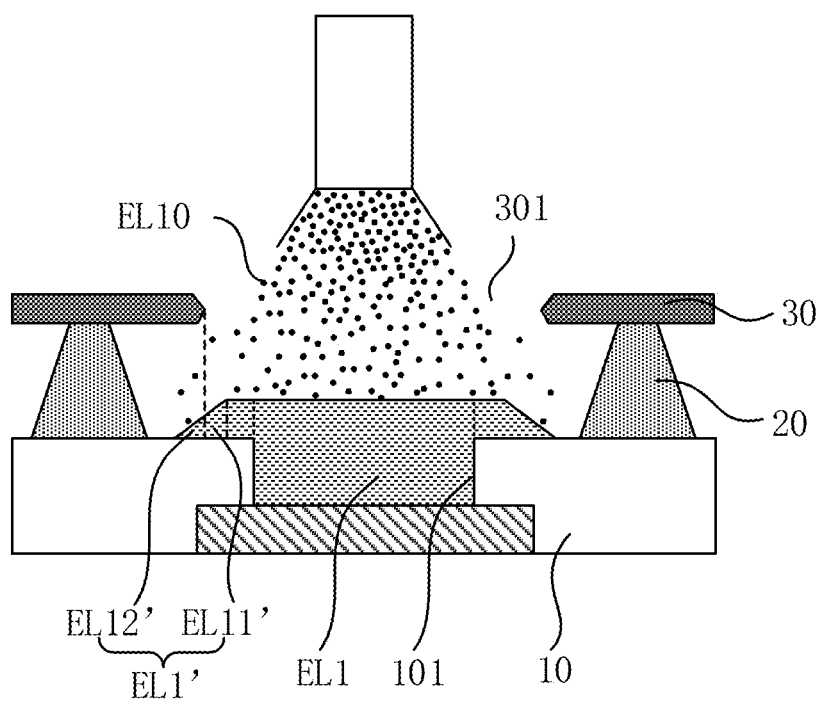
FIG. 4 is a schematic diagram illustrating preparation of a first color light-emitting material layer according to an embodiment of the present disclosure.
Figure 5:
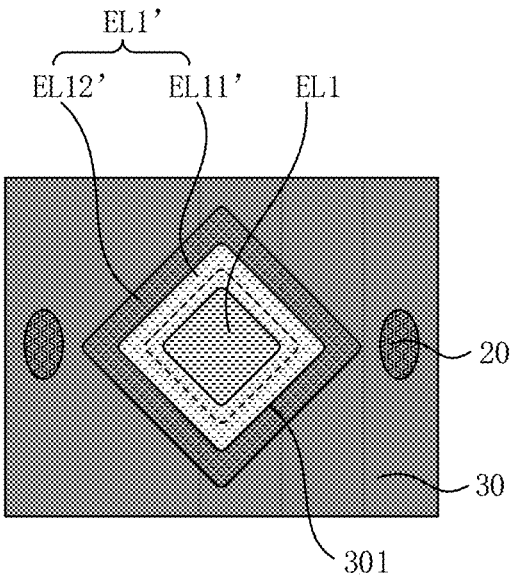
FIG. 5 is a partial plan view of a display panel and a mask plate according to an embodiment of the present disclosure.

FIG. 4 is a schematic diagram illustrating preparation of a first color light-emitting material layer. FIG. 5 is a partial plan view of a display panel and a mask plate With reference to FIG. 4 and FIG. 5, when preparing the first color light-emitting material layer EL1, a corresponding mask plate 30 is disposed on the pixel definition layer 10, and a hollow portion 301 of the mask plate 30 used for preparing the first color light-emitting material layer EL1 exposes the first opening 101. Then, a first color light-emitting material EL10 reaches and continuously deposits in the first opening 101 through the hollow portion 301 of the corresponding mask plate 30, to form the first color light-emitting material layer EL1.

However, during the evaporation process, there is an alignment tolerance between the mask plate 30 and an evaporation substrate, thereby causing a deviation of the hollow portion 301 of the mask plate 30 relative to the opening of the pixel definition layer 10. Considering the alignment accuracy, an area of the hollow portion 301 of the mask plate 30 is larger than an area of the first opening 101, to ensure that the hollow portion 301 can expose the first opening 101 even when there is an alignment deviation of the mask plate 30. In this way, the first opening 101 can be fully filled with the first color light-emitting material layer EL1, thereby avoiding a phenomenon of lack of color in the display.

In order to avoid friction between the mask plate 30 and the light-emitting material layer that has been formed, the mask plate 30 can be supported by spacers 20. That is, a gap is formed between the mask plate 30 and the pixel definition layer 10.

During a process of preparing the mask plate 30, an etching angle can be formed at the hollow portion 301. That is, the hollow portion 301 does not have a uniform width along a thickness direction of the mask plate 30.

In view of the above, a first color shadow layer EL1' can be formed during an evaporation process of the first color light-emitting material layer EL1, and a thickness of the first color shadow layer EL1' will be different from a thickness of an actual to-be-evaporated layer (the first color light-emitting material layer EL10). Taking the hollow portion 301 of the mask plate 30 as a boundary, a first color inner shadow layer EL11' can be formed at an inner side of the corresponding hollow portion 301 of the mask plate 30, and a first color outer shadow layer EL12' can be formed at an outer side of the hollow portion 301 of the mask plate 30. If the first color inner shadow layer EL11' is evaporated in the first opening 101 of the corresponding sub-pixel, a deviation in a thickness of the light-emitting material layer of a part of the first opening 101 can be formed, thereby causing macroscopic mura; and if the first color outer shadow layer EL12' is evaporated in an opening region of another sub-pixel adjacent to the sub-pixel, color-cross can occur.

Figure 6:
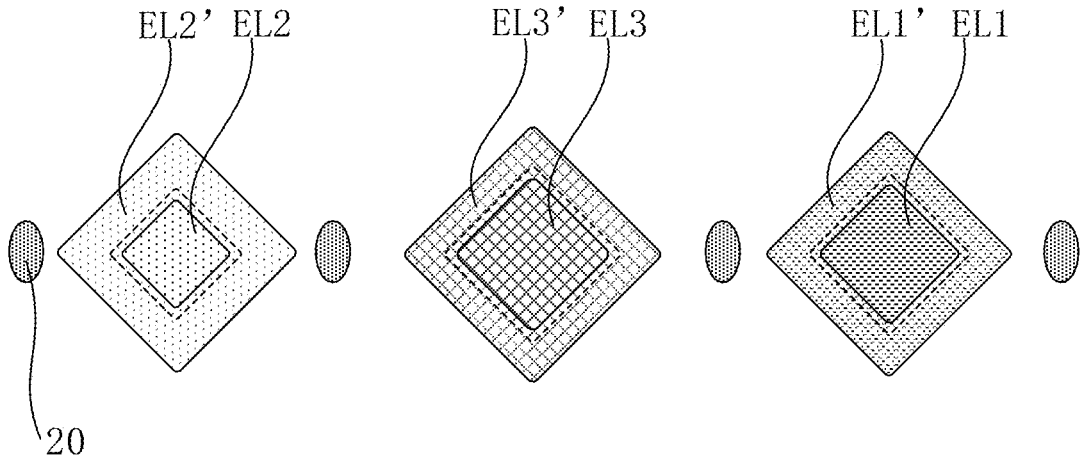
FIG. 6 is a schematic plan view of a light-emitting material layer in a display panel according to some embodiments of the present disclosure.

FIG. 6 is a schematic plan view of a light-emitting material layer in a display panel according to some embodiments of the present disclosure It can be observed from the above preparation process that, when preparing a light-emitting material layer of a color, a shadow layer of the light-emitting material of the same color is formed at a periphery of the light-emitting material of this color. Then, as shown in FIG. 6, a first color shadow layer EL1' is formed at the periphery of the first color light-emitting material layer EL1, a second color shadow layer EL2' is formed at the periphery of the second color light-emitting material layer EL2, and a third color shadow layer EL3' is formed at the periphery of the color light-emitting material layer EL3.

In order to avoid that the shadow layer of the light-emitting material at the periphery of the sub-pixel causes color-cross to an adjacent sub-pixel, the shadow layer of the light-emitting material shall not exceed a region defined by an outer contour of the safe region corresponding to the sub-pixel. That is, as shown in FIG. 6, the first color shadow layer EL1' is located in a region defined by an outer contour of the first safe region S1, the second color shadow layer EL2' is located in a region defined by an outer contour of the second safe region S2, and the third color shadow layer EL3' is located in a region defined by an outer contour of the third safe region S3.

The safe region having a certain area and surrounding the sub-pixel is provided to reduce an influence of the shadow layer of the light-emitting material on adjacent sub-pixels of different colors. Therefore, the safe region corresponding to the sub-pixel can be defined as follows. An outer contour of the periphery of the sub-pixel is expanded to an outer edge of the shadow layer of the light-emitting material corresponding to the sub-pixel. A region that the outer contour of the periphery of the sub-pixel passes during the expansion process is defined as the safe region of the sub-pixel.

As analyzed above, the outer edge of the shadow layer of the light-emitting material is related to a size of the hollow portion 301 of the mask plate 30, a gap between the mask plate 30 and the pixel definition layer 10, and an etching angle of the hollow portion of the mask plate 30. The outer edge of the shadow layer of the light-emitting material is also related to an alignment accuracy of the mask plate 30. The size of the hollow portion of the mask plate 30, the gap between the mask plate 30 and the pixel definition layer 10, and the etching angle of the hollow portion of the mask plate 30 affect an area of the shadow layer of the light-emitting material, which can be understood as affecting a width of the shadow layer of the light-emitting material in one direction. The alignment accuracy of the mask plate 30 affects an offset width of the shadow layer of the light-emitting material relative to the edge of the sub-pixel in one direction.

Then, when determining the safe region based on the prepared sub-pixel, for example, when determining the safe region of the sub-pixel in a product verification stage of the display panel, a distance between an edge of the safe region and the sub-pixel is a sum of a shadow width A and an offset width B, and after determining a distance between the edges of the safe region at different positions and the sub-pixel, the area of the safe region can be determined. The shadow width A is one half of a difference between a distance between two opposite edges of the shadow layer and a distance between two opposite edges of the sub-pixel. The offset width B is an empirical value of an alignment accuracy of the mask plate 30, or an experimental value of the alignment accuracy of the mask plate 30. For example, the empirical value of the alignment accuracy of the mask plate 30 is usually about 3 μm, then the offset portion width B can be about 3 μm. Usually, with the development of technology, the accuracy of the machine can be improved, then the offset width B herein can be 2.5 μm, 2 μm, etc.

Figure 7:
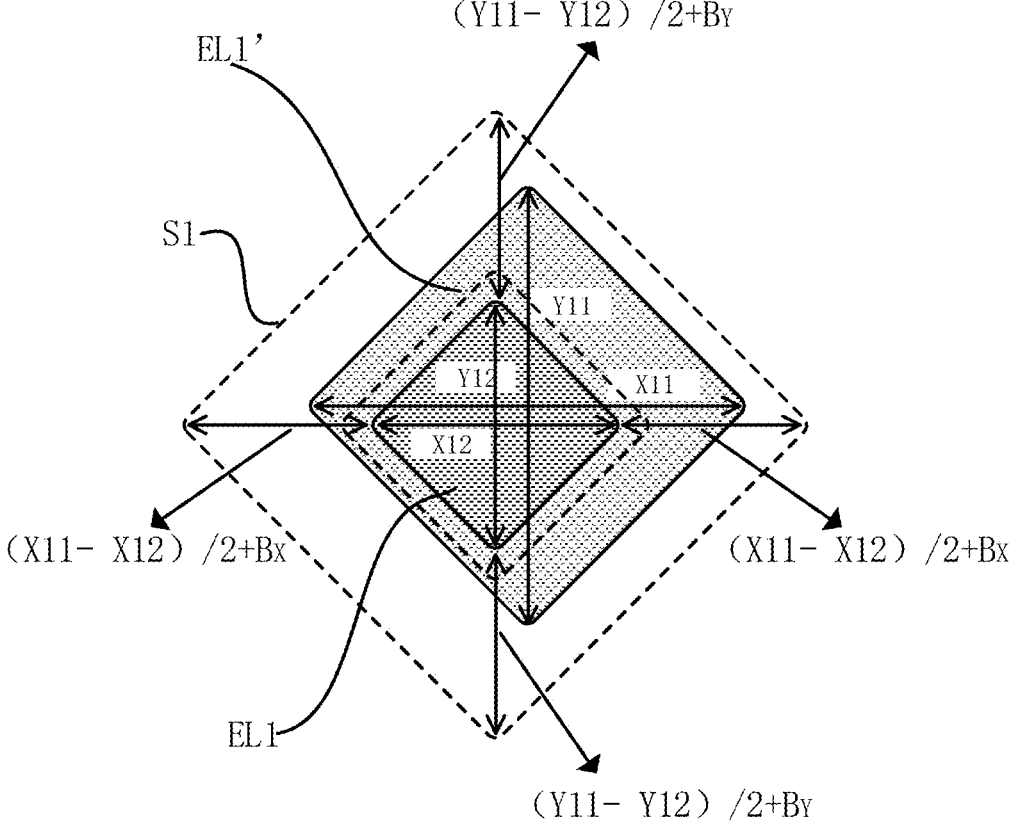
FIG. 7 is a schematic diagram of a method for defining a safe region surrounding a sub-pixel in a display panel according to some embodiments of the present disclosure.

FIG. 7 is a schematic diagram of a method for defining a safe region surrounding a sub-pixel in a display panel according to some embodiments of the present disclosure.

The definition of the first safe region S1 is illustrated as follows by taking the first color sub-pixel PX1 surrounded by the first safe region S1 shown in FIG. 7 as an example. As shown in FIG. 7, a distance between two opposite edges of the first color shadow layer EL1' that are arranged in the first direction X is X11, and a distance between two opposite edges of the first color sub-pixel PX1 that are arranged in the first direction X is X12, then, the shadow width $A_X$ in the first direction X, which is used to determine the first safe region S1, satisfies: $A_X=(X11-X12)/2$. A distance between two opposite edges of the first color shadow layer EL1' that are arranged in the second direction Y is Y11, and a distance between two opposite edges of the first color sub-pixel PX1 that are arranged in the second direction Y is Y12, then, the shadow width $A_Y$ in the second direction Y, which is used to determine the first safe region S1, satisfies: $A_Y=(Y11-Y12)/2$. Then, a distance between the outer edge of the first safe region S1 and the first color sub-pixel PX1 in the first direction X is equal to a sum of the shadow width $A_X$ and the offset width $B_X$. That is, $[(X11-X12)/2+B_X]$. A distance between the outer edge of the first safe region S1 and the first color sub-pixel PX1 in the second direction Y is equal to a sum of the shadow width $A_Y$ and the offset portion width $B_Y$. That is, $[(Y11-Y12)/2+B_Y]$, where $B_X$ is an empirical value of the alignment accuracy of the mask plate 30 in the first direction X or an experimental value of the alignment accuracy of the mask plate 30 in the first direction X, $B_Y$ is an empirical value of the alignment accuracy of the mask plate 30 in the second direction Y or an experimental value of the alignment accuracy of the mask plate 30 in the second direction Y, and $B_X$ can be equal to $B_Y$. According to the above method, the outer edge of the first safe region S1 can be determined, and then the first safe region S1 can be determined. $B_X$ can be 3 μm, 2.5 μm, or 2 μm, and $B_Y$ can be 3 μm, 2.5 μm, or 2 km.

The method for defining each of the second safe region S2 and the third safe region S3 is similar to the method for defining the first safe region S1, and will not be repeated herein.

When different light-emitting material layers are prepared with different parameters such as thickness and/or area, if the light-emitting material layers of different colors are prepared by using the evaporation process, the hollow portions of the mask plates to be used can be different in terms of the area, and/or evaporation time and gas density of the evaporation material, etc. Therefore, the widths of the shadow layers of the light-emitting materials surrounding the sub-pixels of different colors are usually different from each other. That is, the shadow widths A that are used to determine the edges of the safe regions corresponding to the sub-pixels of different colors are usually different from each other. In the embodiments of the present disclosure, an important parameter to control the different areas of the first safe region S1, the second safe region S2 and the third safe region S3 is different widths of the first safe region S1, the second safe region S2 and the third safe region S3 have in a same direction.

The safe regions corresponding to adjacent sub-pixels can partially overlap with each other, and the safe region at the overlapping position belongs to a part of each of the safe regions corresponding to the adjacent sub-pixels. For example, as shown in FIG. 2, the first safe region S1 and the third safe region S3 respectively corresponding to the first color sub-pixel PX1 and the third color sub-pixel PX3 adjacent to each other in the first direction X partially overlap with each other in the first direction X; and the second safe region S2 and the third safe region S3 respectively corresponding to the second color sub-pixel PX2 and the third color sub-pixel PX3 adjacent to each other in the first direction X partially overlap with each other in the first direction X.

In the technical solutions provided by the embodiments of the present disclosure, according to an area of the shadow layer formed when the light-emitting material layer of the sub-pixel is formed, a color-cross risk caused by the shadow layer to a sub-pixel adjacent to the shadow layer can be evaluated, and an area of the safe region surrounding the sub-pixel can be determined according to the color-cross risk. In the embodiments of the present disclosure, the areas of the safe regions respectively surrounding the sub-pixels of different colors are different from each other. In this way, on the one hand, the color-cross between sub-pixels of different colors can be avoided, so as to guarantee the display effect of display panel 01; and on the other hand, each safe region does not occupy an excessive large area under a premise of achieving its function, so as to guarantee the resolution of the display panel 01.

In some embodiments of the present disclosure, as shown in FIG. 2, a light-emitting area of the third color sub-pixel PX3 is larger than a light-emitting area of the first color sub-pixel PX1 and larger than a light-emitting area of the second color sub-pixel PX2, and an area of the third safe region S3 is larger than an area of the first safe region S1.

In some embodiments, the area of the third safe region S3 is larger than an area of the second safe region S2. That is, among the first color sub-pixel PX1, the second color sub-pixel PX2, and the third color sub-pixel PX3, the third color sub-pixel PX3 has the largest area; and among the first safe region S1, the second safe region S2, and the third safe region S3 respectively corresponding to the first color sub-pixel PX1, the second color sub-pixel PX2, and the third color sub-pixel PX3, the third safe region S3 surrounding the third color sub-pixel PX3 has the largest area.

As analyzed above, the area of the hollow portion of the mask plate used to deposit the light-emitting material is larger than an area of an opening formed in the pixel definition layer where the light-emitting material is located. Therefore, a risk of lack of color caused by the incomplete filling of the light-emitting material in the opening due to misalignment of the mask plate can be reduced. A position of the opening formed in the pixel definition layer for accommodating the light-emitting material that is not filled with the light-emitting material is located at an edge of the opening. The larger the area of the sub-pixel is, the longer an edge of the opening in which the light-emitting material is accommodated is, and the greater the risk of lack of color is. Therefore, when depositing the light-emitting material included in the sub-pixel with a larger area, the expanded part of the area of the hollow portion of the mask plate relative to the area of the sub-pixel is larger.

The more the area, relative to the area of the sub-pixel, of the hollow portion of the mask plate used to form the light-emitting material layer in the sub-pixel increases the larger the area of the shadow layer of the light-emitting material at the periphery of the sub-pixel larger is. That is, the greater a risk of color-cross with an adjacent sub-pixel. In this embodiment, among the first color sub-pixel PX1, the second color sub-pixel PX2 and the third color sub-pixel PX3, the third safe region S3 corresponding to the third color sub-pixel PX3 with the largest area is configured to have the largest area, thereby reducing a risk of color-cross between the third color sub-pixel PX3 and its adjacent sub-pixel of a color different from the third color sub-pixel PX3.

In a technical solution according to some embodiments of the present disclosure, the third color sub-pixel PX3 is a blue sub-pixel. In an organic light-emitting display panel including the sub-pixels including organic light-emitting devices, the organic light-emitting device in the blue sub-pixel has a relatively low light-emitting efficiency, which is usually lower than a light-emitting efficiency of the organic light-emitting device in the red sub-pixel, and lower than a light-emitting efficiency of the light emitting device in the green sub-pixel. Therefore, the light-emitting area of the third color sub-pixel PX3 is configured to be larger. That is, the light-emitting area of the third color sub-pixel PX3 is configured to be larger than the light-emitting area of the first color sub-pixel PX1 and larger than the light-emitting area of the second color sub-pixel PX2, so as to compensate the low light-emitting efficiency of the third color sub-pixel PX3.

In some embodiments of the present disclosure, as shown in FIG. 1 and FIG. 2, the first color sub-pixel PX1, the second color sub-pixel PX2, and the third color sub-pixel PX3 are arranged in sequence in the first direction X, and the first color sub-pixels PX1, the second color sub-pixels PX2, and the third color sub-pixels PX3 are arranged alternately in the first direction X. As shown in FIG. 1 and FIG. 2, the sub-pixels arranged in the first direction X form a pixel row. In any one pixel row, the sub-pixels in the pixel row, taking a pixel group as a smallest repeated unit, are periodically arranged, and the pixel group includes a first color sub-pixel PX1, a second color sub-pixel PX2, and a third color sub-pixel PX3.

For example, an odd-numbered pixel row shown in FIG. 2 includes a pixel group G1, and the sub-pixels in the pixel group G1, taking the pixel group G1 as a smallest repeated unit, are periodically arranged. The pixel group G1 includes the second color sub-pixel PX2, the third color sub-pixel PX3, and the first color sub-pixel PX1 that are adjacent to each other and that are arranged in sequence in the first direction X. The even-numbered pixel row shown in FIG. 1 and FIG. 2 includes a pixel group G2, and the sub-pixels in the pixel group G2, taking the pixel group G2 as a smallest repeated unit, are periodically arranged. The pixel group G2 includes a first color sub-pixel PX1, a second color sub-pixel PX2, and a third color sub-pixel PX3 that are adjacent to each other and that are arranged in sequence along the first direction X.

In some embodiments of the present disclosure, the light-emitting area of the third color sub-pixel PX3 is larger than the light-emitting area of the first color sub-pixel PX1 and larger than the light-emitting area of the second color sub-pixel PX2. In the first direction X, a distance between the first color sub-pixel PX1 and its adjacent third color sub-pixel PX3 is greater than a distance between the first color sub-pixel PX1 and its adjacent second color sub-pixel PX2, and a distance between the second color sub-pixel PX2 and its adjacent third color sub-pixel PX3 is greater than a distance between the second color sub-pixel PX2 and its adjacent first color sub-pixel PX1.

As shown in FIG. 2, in a pixel row, a distance $d13$ between the first color sub-pixel PX1 and its adjacent third color sub-pixel PX3 (that is located at a left side of the first color sub-pixel PX1), and a distance $d12$ between the first color sub-pixel PX1 and its adjacent second color sub-pixel PX2 (that is located at a right side of the first color sub-pixel PX1) satisfy: $d13>d12$. That is, the first color sub-pixel PX1 located between the second color sub-pixel PX2 and the third color sub-pixel PX3 is closer to the second color sub-pixel PX2 and farther away from the third color sub-pixel PX3. In this way, color-cross between the third color sub-pixel PX3 and the first color sub-pixel PX1 adjacent to the third color sub-pixel PX3 in the first direction X can be avoided.

In some embodiments, as shown in FIG. 2, in a pixel row, a distance $d23$ between the second color sub-pixel PX2 and its adjacent third color sub-pixel PX3 (that is located at a right side of the second color sub-pixel PX2), and a distance $d12$ between the second color sub-pixel PX2 and its adjacent first color sub-pixel PX1 (that is located at a left side of the second color sub-pixel PX2) satisfy: $d23>d12$. That is, the second color sub-pixel PX2 located between the first color sub-pixel PX1 and the third color sub-pixel PX3 is located closer to first color sub-pixel PX1 and farther away from the third color sub-pixel PX3. In this way, color-cross between the third color sub-pixel PX3 and its adjacent second color sub-pixel PX2 in the first direction X can be avoided.

In the embodiments, $d13>d12$ and $d23>d12$, therefore, the third color sub-pixel PX3 has a greater distance from each of the first color sub-pixel PX1 and the second color sub-pixel PX2 (that are respectively located at a left side and a right side of the third color sub-pixel PX3), thereby avoiding color-cross between the third color sub-pixel PX3 and the sub-pixel of a different color from the third color sub-pixel PX3 adjacent to the third color sub-pixel PX3 in the first direction X. In the embodiments, $d13>d12$ and $d23>d12$, so that the area of the third safe region S3 can be larger than the area of the first safe region S1 and larger than the area of the second safe region S2.

Figure 8:
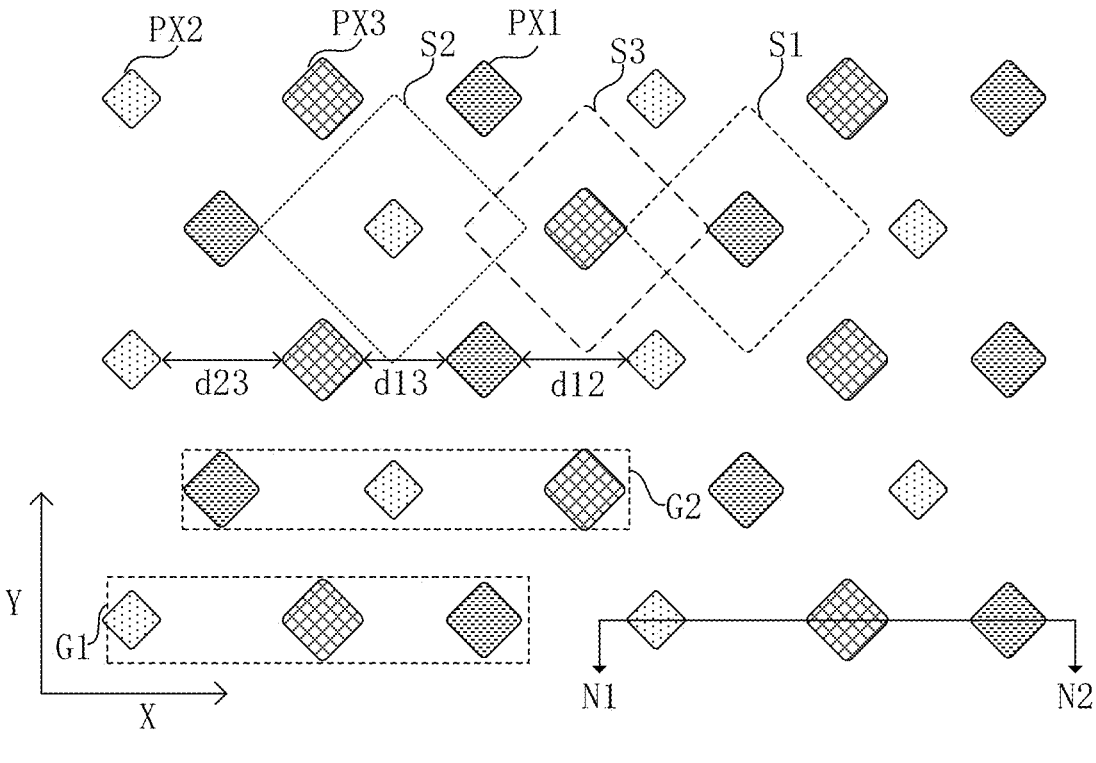
FIG. 8 is a schematic diagram of an arrangement of sub-pixels in a display panel according to some embodiments of the present disclosure.
Figure 9:
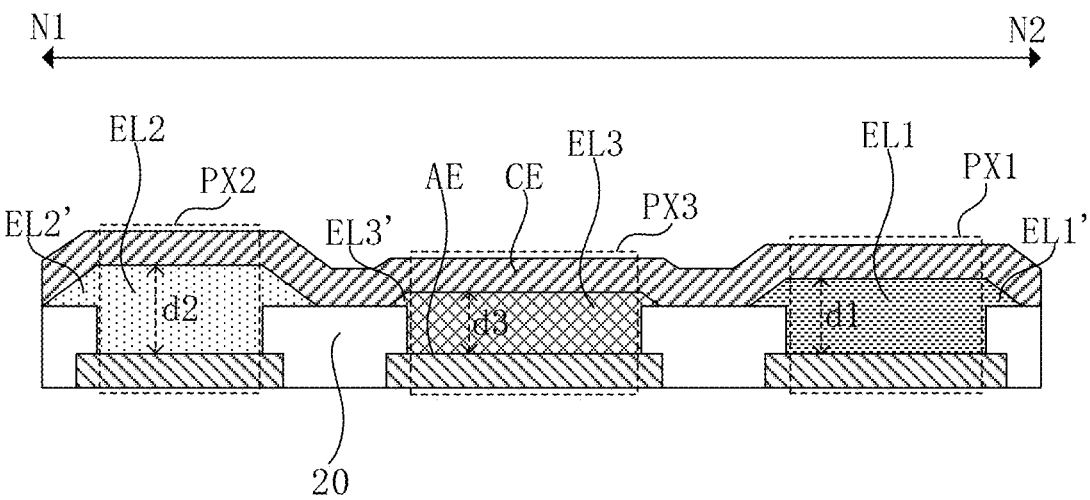
FIG. 9 is a cross-sectional view along line N1-N2 shown in FIG. 8 according to an embodiment of the present disclosure.

FIG. 8 is a schematic diagram of an arrangement of sub-pixels in a display panel according to some embodiments of the present disclosure. FIG. 9 is a cross-sectional view along N1-N2 shown in FIG. 8.

In some embodiments of the present disclosure, in combination with FIG. 8 and FIG. 9, the first color sub-pixel PX1 includes a first color light-emitting material layer EL1, the second color sub-pixel PX2 includes a second color light-emitting material layer EL2, and the third color sub-pixel PX3 includes a third color light-emitting material layer EL3. The first color light-emitting material layer EL1 is located between the cathode CE and the anode AE of the first color sub-pixel PX1 and is configured to emit first color light under driving of the cathode CE and the anode AE of the first color sub-pixel PX1. The second color light-emitting material layer EL2 is located between the cathode CE and the anode AE of the second color sub-pixel PX1 and is configured to emit second color light under driving of the cathode CE and the anode AE of the second color sub-pixel PX2. The third color light-emitting material layer EL3 is located between the cathode CE and the anode AE of the third color sub-pixel PX3, and is configured to emit third color light under driving of the cathode CE and the anode AE of the third color sub-pixel PX3.

In an embodiment of the present disclosure, as shown in FIG. 9, a thickness d2 of the second color light-emitting material layer EL2 is greater than a thickness d1 of the first color light-emitting material layer EL1 and greater than a thickness d3 of the third color light-emitting material layer EL3. That is, among the first color light-emitting material layer EL1, the second color light-emitting material layer EL2, and the third color light-emitting material layer EL3 respectively included in the first color sub-pixel PX1, the second color sub-pixel PX2 and the third color sub-pixel PX3, the thickness d2 of the second color light-emitting material layer EL2 included in the second color sub-pixel PX2 is the greatest.

Then, when preparing the light-emitting material layers of various colors using an evaporation process, the evaporation time for preparing the second color light-emitting material layer EL2 is longer, and/or the gas density of the second color light-emitting material is higher, which can result in an additional increase in the width of the second color shadow layer EL2'. For example, as shown in FIG. 8, a width of the second color shadow layer EL2' is greater than a width of the first color shadow layer EL1'.

In some embodiments of the present disclosure, as shown in FIG. 8, an area of the second safe region S2 is larger than an area of the first safe region S1. The greater the width of the shadow layer of a sub-pixel, the greater a risk of color-cross between the sub-pixel and its adjacent sub-pixel. In the embodiments of the present disclosure, among the first color sub-pixel PX1 and the second color sub-pixel PX2, the second safe region S2 corresponding to the second color sub-pixel PX2 with a greater width of the shadow layer is configured to have a larger area, so that a risk of color-cross between the second color sub-pixel PX2 and its adjacent sub-pixel of a different color can be reduced.

In some embodiments, in combination with FIG. 8 and FIG. 9, a width of the second color shadow layer EL2' is greater than a width of the third color shadow layer EL3', and an area of the second safe region S2 is greater than an area of the third safe region S3.

In a technical solution according to some embodiments of the present disclosure, the second color sub-pixel PX2 is a red sub-pixel. In an organic light-emitting display panel. That is, in a display panel in which the sub-pixel includes an organic light-emitting device, a thickness of the red light-emitting material layer included in the red sub-pixel is greater than a thickness of a blue light-emitting material layer included in the blue sub-pixel and greater than a thickness of a green light-emitting material layer included in the green sub-pixel.

In some configurations, an area of a red sub-pixel is usually smaller than an area of a green sub-pixel and smaller than an area of a blue sub-pixel. However, when considering a safe region surrounding a sub-pixel, a red sub-pixel with a smaller area does not increase the resolution of the display panel or even reduces the resolution of the display panel. This is because, if the area of the red sub-pixel is too small, a thickness of the red light-emitting material layer included in the red sub-pixel can be larger, and an influence of the increase of the thickness of the red light-emitting material layer on the area of the safe region surrounding the red sub-pixel is greater than an influence of the decrease of the area of the red sub-pixel area on the area of the safe region surrounding the red sub-pixel. That is, the increase in the area of the safe region surrounding the red sub-pixel due to the increase in the thickness of the red light-emitting material layer is greater than the decrease in the area of the safe region surrounding the red sub-pixel due to the decrease in the area of the red sub-pixel. Therefore, in the technical solutions according to the embodiments of the present disclosure, the area of the red sub-pixel can be relatively large without significantly reducing the resolution of the display panel. For example, the area of the red sub-pixel can be substantially equal to the area of the green sub-pixel. For example, a difference between the area of the red sub-pixel and the area of the green sub-pixel is within 10%.

In some embodiments, when a difference between the area of the red sub-pixel and the area of the green sub-pixel is small, the area of the red sub-pixel, the area of the green sub-pixel, and the area of the blue sub-pixel can be substantially equal to each other. Then, among the safe region surrounding the red sub-pixel, the safe region surrounding the green sub-pixel, and the safe region surrounding the blue sub-pixel, an overlapping area between adjacent safe regions can be larger. Therefore, the area of the sub-pixel of each color can be increased without increasing a risk of color-cross between sub-pixels of different colors. For example, a difference between the area of the red sub-pixel and the area of the green sub-pixel is within 10%, and a difference between the area of the blue sub-pixel and the area of the red sub-pixel is within 30%.

In some embodiments of the present disclosure, as shown in FIG. 8, the first color sub-pixel PX1, the second color sub-pixel PX2, and the third color sub-pixel PX3 are arranged in sequence in the first direction X, and the first color sub-pixels PX1, the second color sub-pixels PX2, and the third color sub-pixels PX3 are arranged alternatively. An arrangement of the sub-pixels of different colors shown in FIG. 8 is the same as the arrangement of the sub-pixels of different colors shown in FIG. 2, and will not be repeated herein.

In some embodiments of the present disclosure, as shown in FIG. 9, a width of the second color shadow layer EL2' at the periphery of the second color sub-pixel PX2 is greater than a width of the first color shadow layer EL1' at the periphery of the first color sub-pixel PX1, and is also greater than a width of the third color shadow layer EL3' at the periphery of the third color sub-pixel PX3. In the first direction X, a distance between the third color sub-pixel PX3 and its adjacent second color sub-pixel PX2 is greater than a distance between the third color sub-pixel PX3 and its adjacent first color sub-pixel PX1.

As shown in FIG. 8, in the first direction, a distance d23 between the third color sub-pixel PX3 and its adjacent second color sub-pixel PX2 (that is located at a left side of the third color sub-pixel PX3), and a distance d13 between the third color sub-pixel PX3 and its adjacent first color sub-pixel PX1 (that is located at a right side of the third color sub-pixel PX3) satisfy d23>d13. That is, the third color sub-pixel PX3 located between the first color sub-pixel PX1 and the second color sub-pixel PX2 can be closer to the first color sub-pixel PX1 and farther away from the second color sub-pixel PX2. In this way, color-cross between the second color shadow layer EL2' at a periphery of the second color sub-pixel PX2 and its adjacent third color sub-pixel PX3 in the first direction X can be avoided.

In the embodiments, d23>d13, therefore, a distance between the second color sub-pixel PX2 and the third color sub-pixel PX1 is larger, thereby avoiding color-cross between the second color shadow layer EL2' at a periphery of the second color sub-pixel PX2 and its adjacent third color sub-pixel PX3 in the first direction X. In the embodiments, d23>d13, so that the area of the second safe region S2 can be larger than the area of the first safe region S1.

In some embodiments, as shown in FIG. 8, when the area of the second safe region S2 is larger than the area of the third safe region S3, a distance d12 between the first color sub-pixel PX1 and its adjacent second color sub-pixel PX2 in the first direction X, and a distance d13 between the first color sub-pixel PX1 and its adjacent third color sub-pixel PX3 satisfy: d12>d13. That is, the first color sub-pixel PX1 located between the third color sub-pixel PX3 and the second color sub-pixel PX2 is closer to the third color sub-pixel PX3 and farther away from the second color sub-pixel PX2. In this way, color-cross between the second color shadow layer EL2' at a periphery of the second color sub-pixel PX2 and its adjacent first color sub-pixel PX1 in the first direction X can be avoided.

In the embodiments, d23>d13 and d12>d13, therefore, the second color sub-pixel PX2 is far away from the first color sub-pixel PX1 and the third color sub-pixel PX3 that are respectively located at a left side and a right side of the first color sub-pixel PX1, thereby avoiding cross-color between the second color sub-pixel PX2 and its adjacent sub-pixel of a different color in the first direction X. In the embodiment, d23>d13 and d12>d13, so that the area of the second safe region S2 can be larger than the area of the first safe region S1 and larger than the area of the third safe region S3.

Figures 10, 11:
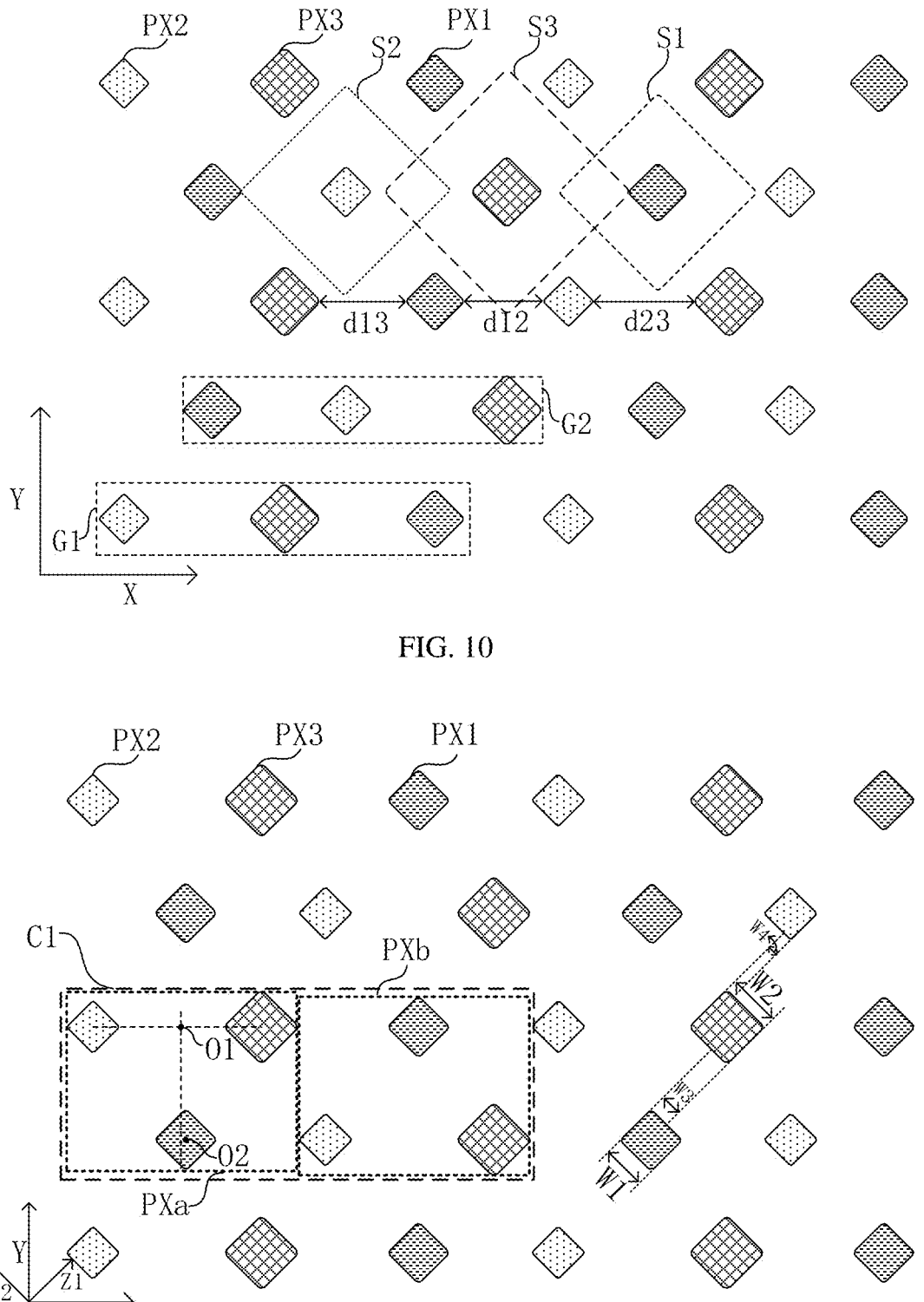
FIG. 10 is a schematic diagram of an arrangement of sub-pixels in a display panel according to some embodiments of the present disclosure.
FIG. 11 is a schematic diagram of an arrangement of sub-pixels in a display panel according to some embodiments of the present disclosure.

FIG. 10 is a schematic diagram of an arrangement of sub-pixels in a display panel according to some embodiments of the present disclosure.

In some embodiments of the present disclosure, when the light-emitting area of the third color sub-pixel PX3 is larger than the light-emitting area of the first color sub-pixel PX1 and larger than the light-emitting area of the second color sub-pixel PX2, and the thickness d2 of the second color light-emitting material layer EL2 is greater than the thickness d1 of the first color light-emitting material layer EL1 and greater than the thickness d3 of the third color light-emitting material layer EL3, as shown in FIG. 10, the area of the third safe region S3 is larger than the area of the second safe region S2, and the area of the second safe region S2 is larger than the area of the first safe region S1.

The third color sub-pixel PX3 can be a blue sub-pixel, the second color sub-pixel PX2 can be a red sub-pixel, the first color sub-pixel PX1 can be a green sub-pixel. In the first direction X, the first color sub-pixel PX1, the second color sub-pixel PX2, and the third color sub-pixel PX3 are arranged in sequence, and the first color sub-pixels PX1, the second color sub-pixels PX2, and the third color sub-pixels PX3 are alternately arranged.

In a technical solution according to some embodiments of the present disclosure, as shown in FIG. 10, in the first direction X, a distance between the first color sub-pixel PX1 and its adjacent third color sub-pixel PX3 is larger than a distance between the first color sub-pixel PX1 and its adjacent second color sub-pixel PX2, a distance between the second color sub-pixel PX2 and its adjacent third color sub-pixel PX3 is greater than a distance between the second color sub-pixel PX2 and its adjacent first color sub-pixel PX1, and a distance between the third color sub-pixel PX3 and its adjacent second color sub-pixel PX2 is greater than a distance between the third color sub-pixel PX3 and its adjacent first color sub-pixel PX1. That is, d13>d12, d23>d12, and d23>d13.

That is, for the first color sub-pixels PX1, the second color sub-pixels PX2 and the third color sub-pixels PX3, which are alternately arranged, and among which the second color sub-pixel PX2, and the third color sub-pixel PX3 are arranged in sequence in the first direction X, a distance d23 between the third color sub-pixel PX3 and the second color sub-pixel PX2 that are adjacent to each other is the greatest, a distance d12 between the second color sub-pixel PX3 and the first color sub-pixel PX1 that are adjacent to each other is the smallest, and a distance d13 between the third color sub-pixel PX3 and the first color sub-pixel PX1 that are adjacent to each other is between d23 and d12.

The distance between the third color sub-pixel PX3 and the second color sub-pixel PX2 is the greatest, so as to take both a large area of the hollow portion of the mask plate used to form the light-emitting material included in the third color sub-pixel PX3 and a large thickness of the light-emitting material included in the second color sub-pixel PX2 into account, which can respectively result in a large area of the third color shadow layer EL3' and a large area of the second color shadow layer EL2' to cause a risk of color-cross between the second color sub-pixel PX2 and the third color sub-pixel PX3.

In the embodiment, d13>d12, d23>d12, and d23>d13, so that it can easily achieve that each of the area of the second safe region S2 and the area of the third safe region S3 is larger than the area of the first safe region S1. Since each of the area of the second safe region S2 and the area of the third safe region S3 is relatively large, an overlapping area between the two can be increased, which is beneficial to optimize the arrangement of the sub-pixels to increase the resolution.

FIG. 11 is a schematic diagram of an arrangement of sub-pixels in a display panel according to some embodiments of the present disclosure.

In some embodiments of the present disclosure, as shown in FIG. 11, the first color sub-pixels PX1, the second color sub-pixels PX2 and the third color sub-pixels PX3 included in the display panel 01 are periodically arranged with a first minimum repeat unit C1, and the first minimum repeat unit C1 includes a first pixel PXa and a second pixel PXb adjacent to each other in the first direction X.

Each of the first pixel PXa and the second pixel PXb includes a first color sub-pixel PX1, a second color sub-pixel PX2 and a third color sub-pixel PX3. In the first pixel PXa, the second color sub-pixel PX2 and the third color sub-pixel PX3 are adjacent to each other in the first direction X, the first color sub-pixel PX1 and the second color sub-pixel PX2 overlap with each other in the second direction Y, and the first color sub-pixel PX1 and the third color sub-pixel PX3 overlap with each other in the second direction Y. In the second pixel PXb, the second color sub-pixel PX2 and the third color sub-pixel PX3 are adjacent to each other in the first direction X, the first color sub-pixel PX1 and the second color sub-pixel PX2 overlap with each other in the second direction Y, and the first color sub-pixel PX1 and the third color sub-pixel PX3 overlap with each other in the second direction Y. The second direction Y intersects the first direction X. In an example, the second direction Y can be perpendicular to the first direction X. That is, in each of the first pixel PXa and the second pixel PXb, the first color sub-pixel PX1, the second color sub-pixel PX2 and the third color sub-pixel PX3 are arranged in a shape of a Chinese character "a".

For the first pixel PXa and the second pixel PXb adjacent to each other in the first direction X, the first color sub-pixel PX1 in the first pixel PXa is adjacent to the second color sub-pixel PX2 or the third color sub-pixel PX3 in the second pixel PXb, and the first color sub-pixel PX1 in the second pixel PXb is adjacent to the second color sub-pixel PX2 or the third color sub-pixel PX3 in the first pixel PXa. As shown in FIG. 11, in the first minimum repeat unit C1, the first color sub-pixel PX1 in the first pixel PXa and the second color sub-pixel PX2 and the third color sub-pixel PX3 in the second pixel PXb are arranged in the first direction X, and the first color sub-pixel PX1 in the second pixel PXb and the second color sub-pixel PX2 and the third color sub-pixel PX3 in the first pixel PXa are arranged in the first direction X.

In an embodiment of the present disclosure, as shown in FIG. 11, the first pixels PXa can be adjacent to each other along the second direction Y, and the second pixels PXb can be adjacent to each other along the second direction Y. For example, as shown in FIG. 11, the first color sub-pixels PX1 are arranged sequentially along the second direction Y, the second color sub-pixels PX2 are arranged sequentially along the second direction Y, the third color sub-pixels PX3 are arranged sequentially along the second direction Y, and the first color sub-pixels PX1, the second color sub-pixels PX2 and the third color sub-pixels PX3 are alternately arranged along the first direction.

In a technical solution according to some embodiments of the present disclosure, as shown in FIG. 11, in each of the first pixel PXa and the second pixel PXb, along the second direction Y, a midpoint 01 between the second color sub-pixel PX2 and the third color sub-pixel PX3 overlaps with the first color sub-pixel PX1. That is, a midperpendicular of a line connecting a center of the second color sub-pixel PX2 and a center of the third color sub-pixel PX3 passes through the first color sub-pixel PX1. In this way, the sub-pixels of different colors in a same pixel can have a better color mixing effect.

In each of the first pixel PXa and the second pixel PXb, a midpoint 01 between the second color sub-pixel PX2 and the third color sub-pixel PX3 and a center 02 of the first color sub-pixel PX1 can be staggered from each other in the second direction Y. That is, a midperpendicular of a line connecting the center of the second color sub-pixel PX2 and the center of the third color sub-pixel PX3 passes through the first color sub-pixel PX1 and does not pass through the center 02 of the first color sub-pixel PX1.

In an embodiment of the present disclosure, the first color sub-pixel PX1 is a green sub-pixel. Since the human eye is more sensitive to green, the green sub-pixel in a pixel is arranged to overlap with a midpoint between the other two sub-pixels in this pixel, which is easy to achieve a white balance of the pixel.

In some technical solutions of the present disclosure, as shown in FIG. 11, the centers of the first color sub-pixels PX1 arranged along the first direction X are aligned with each other in the first direction X. That is, the centers of the first color sub-pixel PX1 arranged along the first direction X are located on a straight line.

In some technical solutions of the present disclosure, as shown in FIG. 11, the centers of the second color sub-pixels PX2 arranged along the first direction X are aligned with each other in the first direction X. That is, the centers of the second color sub-pixels PX2 arranged along the first direction X are located on a straight line.

In some technical solutions of the present disclosure, as shown in FIG. 11, the centers of the third color sub-pixels PX3 arranged along the first direction X are aligned with each other in the first direction X. That is, the centers of the third color sub-pixels PX3 arranged along the first direction X are located on a straight line.

In a technical solution according to some embodiments of the present disclosure, as shown in FIG. 11, the centers of the first color sub-pixels PX1 arranged along the first direction X are aligned with each other in the first direction, the centers of the second color sub-pixels PX2 arranged along the first direction X are aligned with each other in the first direction, and the centers of the third color sub-pixels PX3 arranged along the first direction X are aligned with each other in the first direction.

Figure 12:
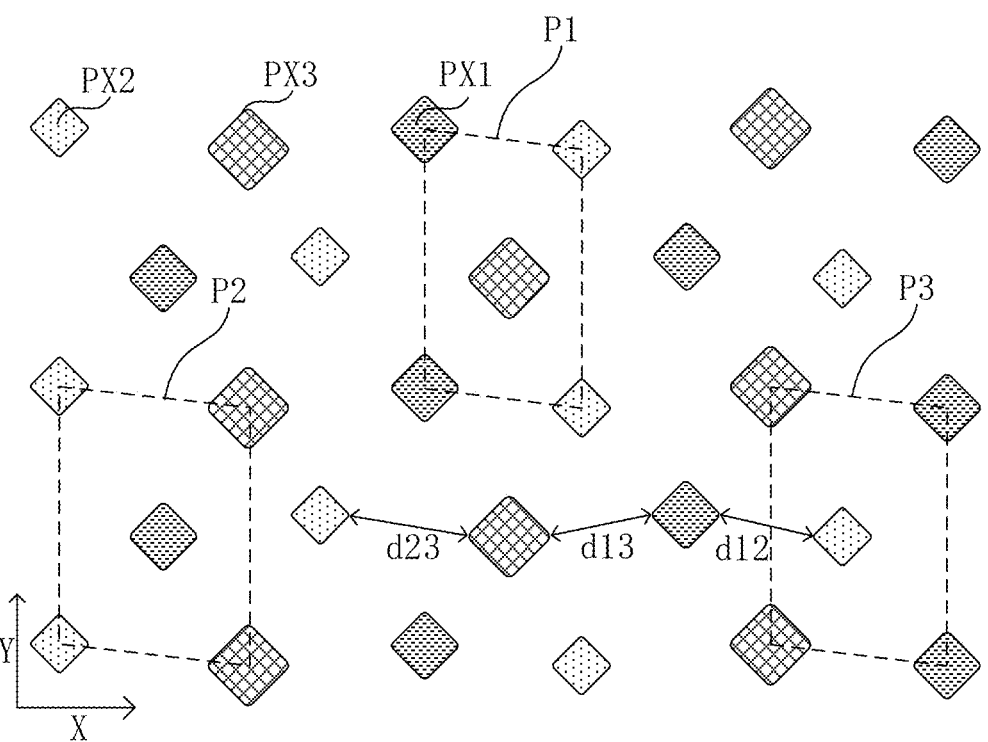
FIG. 12 is a schematic diagram of an arrangement of sub-pixels in a display panel according to some embodiments of the present disclosure.

FIG. 12 is a schematic diagram of an arrangement of sub-pixels in a display panel according to some embodiments of the present disclosure.

In some technical solutions of the present disclosure, as shown in FIG. 12, the centers of the first color sub-pixels PX1 arranged along the first direction X are staggered from each other in the first direction X. That is, the centers of the first color sub-pixels PX1 arranged along the first direction X are located on a fold line.

As shown in FIG. 12, although the centers of the first color sub-pixel PX1 arranged along the first direction X are staggered from each other in the first direction X, the first color sub-pixels PX1 arranged along the first direction X can overlap with each other in the first direction X.

In some technical solutions of the present disclosure, as shown in FIG. 12, the centers of the second color sub-pixels PX2 arranged along the first direction X are staggered from each other in the first direction X. That is, the centers of the second color sub-pixels PX2 arranged along the first direction X are located on a fold line.

As shown in FIG. 12, although the centers of the second color sub-pixels PX2 arranged along the first direction X are staggered from each other in the first direction X, the second color sub-pixels PX2 arranged along the first direction X can overlap with each other in the first direction X.

In some technical solutions of the present disclosure, as shown in FIG. 12, the centers of the third color sub-pixels PX3 arranged along the first direction X are staggered from each other in the first direction X. That is, the centers of the third color sub-pixel PX3 arranged along the first direction X are located on a fold line.

As shown in FIG. 12, although the centers of the third color sub-pixels PX3 arranged along the first direction X are staggered from each other in the first direction X, the third color sub-pixels PX3 arranged along the first direction X can overlap with each other in the first direction X.

In some technical solutions according to the embodiments of the present disclosure, as shown in FIG. 12, the centers of the first color sub-pixels PX1 arranged along the first direction X are staggered from each other in the first direction X, the centers of the second color sub-pixels PX2 arranged along the first direction X are staggered from each other in the first direction X, and the centers of the third color sub-pixels PX3 arranged along the first direction X are staggered from each other in the first direction X.

When the centers of the sub-pixels of a same color are staggered from each other in the first direction X, the centers of the sub-pixels of different colors are also staggered from each other in the first direction X. When the centers of adjacent sub-pixels of different colors are staggered from each other in the first direction X, a distance between the adjacent sub-pixels increases, so that a safe region with a larger area can be provided, thereby increasing an area of the sub-pixel.

Figure 13:
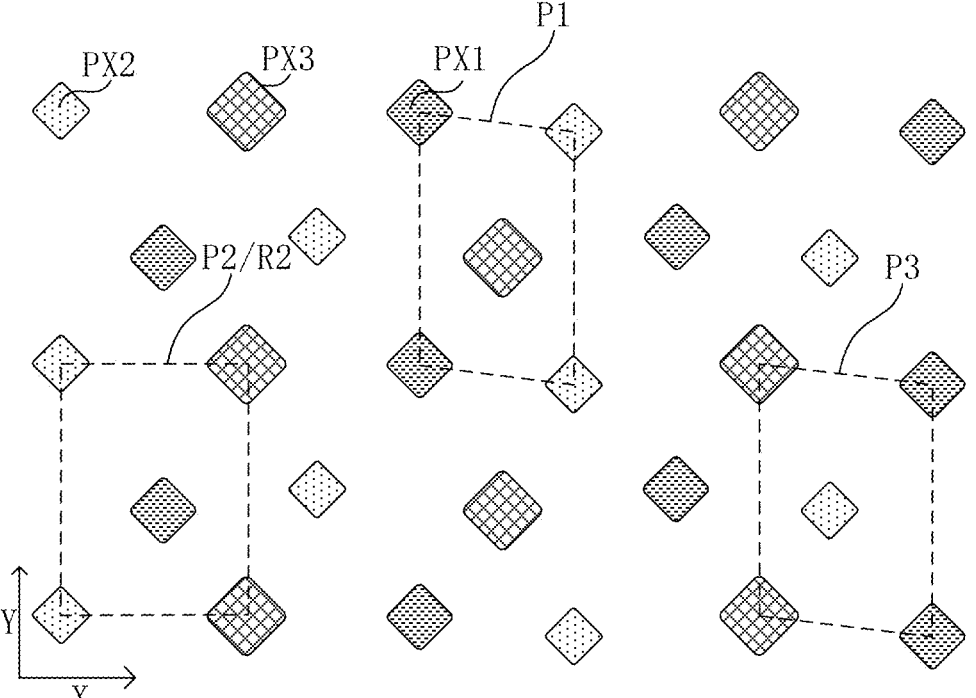
FIG. 13 is a schematic diagram of an arrangement of sub-pixels in a display panel according to some embodiments of the present disclosure.

FIG. 13 is a schematic diagram of an arrangement of sub-pixels in a display panel according to some embodiments of the present disclosure.

In some technical solutions of the present disclosure, among the first color sub-pixels PX1, the second color sub-pixels PX2 and the third color sub-pixels PX3, the centers of at least two sub-pixels of a same color arranged along the first direction X are staggered from each other in the direction X, and the centers of at least two sub-pixels of a same color arranged along the first direction X are aligned with each other in the first direction X.

For example, as shown in FIG. 13, the first color sub-pixels PX1 in each row are arranged along the first direction X and the centers of adjacent first color sub-pixels PX1 of the first color sub-pixels PX1 in the row are staggered from each other in the first direction X; the second color sub-pixels PX2 in each row are arranged along the first direction X and the centers of adjacent second color sub-pixels PX2 of the second color sub-pixels PX2 in the row are staggered from each other in the first direction X; and the third color sub-pixels PX3 in each row of a first row, a third row and a fifth row are arranged along the first direction X and the centers of the third color sub-pixels PX3 in the row are aligned with each other in the first direction X.

In some technical solutions of the present disclosure, as shown in FIG. 11, the centers of the first color sub-pixel PX1 arranged along the second direction Y are aligned with each other in the second direction. That is, the centers of the first color sub-pixels PX1 arranged along the second direction Y are located on a straight line.

In some technical solutions of the present disclosure, as shown in FIG. 11, the centers of the second color sub-pixels PX2 arranged along the second direction Y are aligned with each other in the second direction Y. That is, the centers of the second color sub-pixels PX2 arranged along the second direction Y are located on a straight line.

In some technical solutions of the present disclosure, as shown in FIG. 11, the centers of the third color sub-pixels PX3 arranged along the second direction Y are aligned with each other in the second direction. That is, the centers of the third color sub-pixels PX3 arranged along the second direction Y are located on a straight line.

In a technical solution according to some embodiments of the present disclosure, as shown in FIG. 11, the centers of the first color sub-pixels PX1 arranged along the second direction Y are aligned with each other in the second direction Y, the centers of the second color sub-pixels PX2 arranged along the second direction Y are aligned with each other in the second direction Y, and the centers of the third color sub-pixels PX3 arranged along the second direction Y are aligned with each other in the second direction Y.

Figure 14:
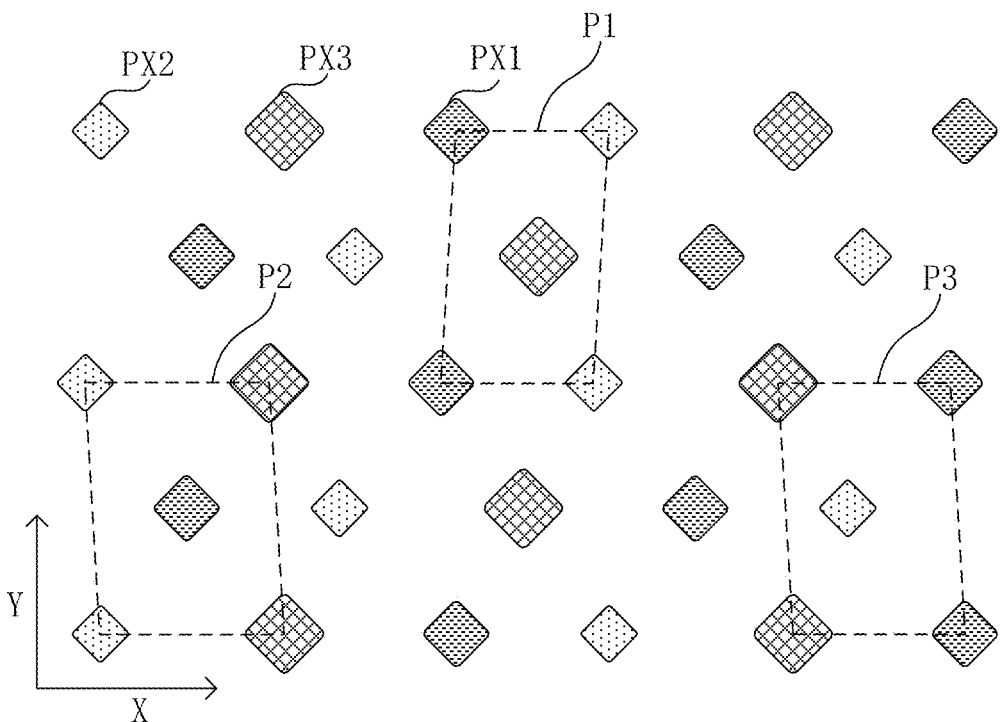
FIG. 14 is a schematic diagram of an arrangement of sub-pixels in a display panel according to some embodiments of the present disclosure.

FIG. 14 is a schematic diagram of an arrangement of sub-pixels in a display panel according to some embodiments of the present disclosure.

In some technical solutions of the present disclosure, as shown in FIG. 14, the centers of the first color sub-pixels PX1 arranged along the second direction Y are staggered from each other in the second direction Y. That is, the centers of the first color sub-pixels PX1 arranged along the second direction Y are located on a fold line.

As shown in FIG. 14, although the centers of the first color sub-pixels PX1 arranged along the second direction Y are staggered from each other in the second direction Y, the first color sub-pixels PX1 arranged along the second direction Y can overlap with each other in the second direction Y.

In some technical solutions of the present disclosure, as shown in FIG. 14, the centers of the second color sub-pixels PX2 arranged along the second direction Y are staggered from each other in the second direction Y. That is, the centers of the second color sub-pixels PX2 arranged along the second direction Y are located on a fold line.

As shown in FIG. 14, although the centers of the second color sub-pixels PX2 arranged along the second direction Y are staggered from each other in the second direction Y, the second color sub-pixels PX2 arranged along the second direction Y can overlap with each other in the second direction Y.

In some technical solutions of the present disclosure, as shown in FIG. 14, the centers of the third color sub-pixels PX3 arranged along the second direction Y are staggered from each other in the second direction Y. That is, the centers of the third color sub-pixels PX3 arranged along the second direction Y are located on a fold line.

As shown in FIG. 14, although the centers of the third color sub-pixels PX3 arranged along the second direction Y are staggered from each other in the second direction Y, the third color sub-pixels PX3 arranged along the second direction Y can overlap with each other in the second direction Y.

In some technical solutions according to the embodiments of the present disclosure, as shown in FIG. 14, the centers of the first color sub-pixels PX1 arranged along the second direction Y are staggered from each other in the second direction Y, the centers of the second color sub-pixels PX2 arranged along the second direction Y are staggered from each other in the second direction Y, and the centers of the third color sub-pixels PX3 arranged along the second direction Y are staggered from each other in the second direction Y.

As shown in FIG. 14, a row direction can be the first direction X and a column direction can be the second direction Y, and the centers of adjacent sub-pixels of a same color in a same column are staggered from each other in the second direction Y, then two sub-pixels of the adjacent sub-pixels located in a same column have different distances from their adjacent sub-pixels in their respective rows. For example, a topmost third color sub-pixel PX3 of the third color sub-pixels PX3 in a first column and a middle third color sub-pixel PX3 of the third color sub-pixels PX3 in the first column staggered from each other in the column direction, then, a distance between the topmost third color sub-pixel PX3 and the second color sub-pixel PX2 located at a left side of the topmost third color sub-pixel PX3 can be different from a distance between the middle third color sub-pixel PX3 and a second color sub-pixel PX2 located at a left side of the middle third color sub-pixel PX3, and a distance between the topmost third color sub-pixel PX3 and a first color sub-pixel PX1 located at a right side of the topmost third color sub-pixel PX3 can be different from a distance between the middle third color sub-pixel PX3 and a first color sub-pixel PX1 located at a right side of the middle third color sub-pixel PX3. That is, the areas of the safe regions of different sub-pixels can be flexibly adjusted, for example, an overlapping area between the safe regions of adjacent sub-pixels can be increased.

Figure 15:
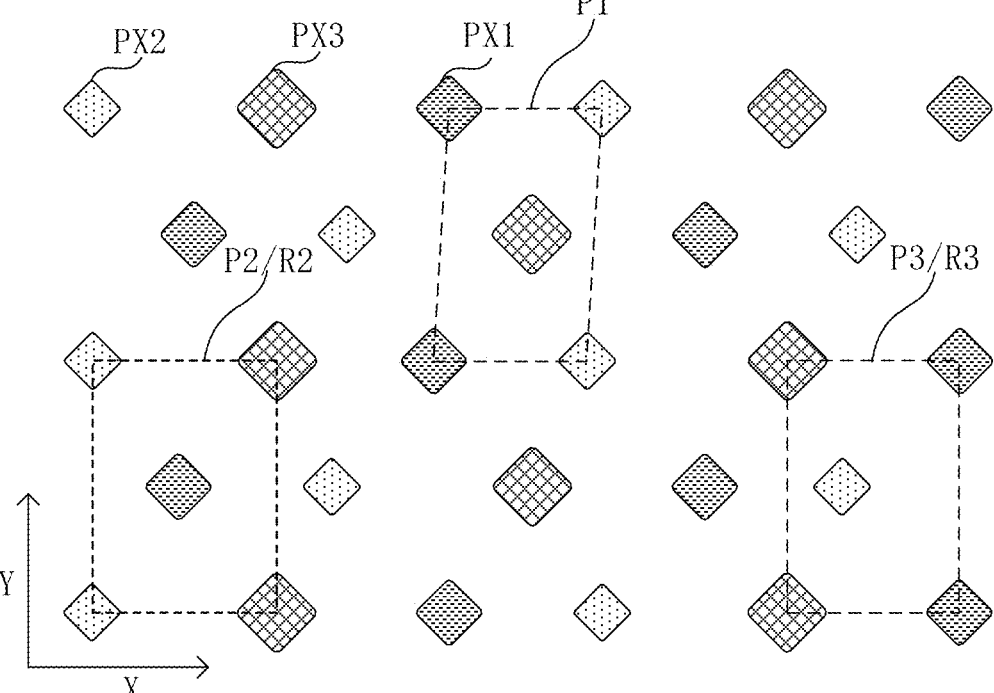
FIG. 15 is a schematic diagram of an arrangement of sub-pixels in a display panel according to some embodiments of the present disclosure.

FIG. 15 is a schematic diagram of an arrangement of sub-pixels in a display panel according to some embodiments of the present disclosure.

In some technical solutions of the present disclosure, among the first color sub-pixels PX1, the second color sub-pixels PX2, and the third color sub-pixels PX3, centers of at least some sub-pixels of a same color arranged along the second direction Y are staggered from each other in the direction Y, and centers of at least two sub-pixels of a same color arranged along the second direction Y are aligned with each other in the second direction Y.

For example, as shown in FIG. 15, the first color sub-pixels PX1 in a rightmost column are arranged along the second direction Y, and centers of these first color sub-pixels PX1 are aligned with each other in the second direction Y; the second color sub-pixels PX2 in a leftmost column are arranged along the second direction Y, and centers of these second color sub-pixels PX2 are aligned with each other in the second direction Y; and third color sub-pixels PX3 in any one column are arranged along the second direction Y, and centers of these third color sub-pixels PX3 are aligned with each other in the second direction Y. As shown in FIG. 15, among sub-pixels in a fifth column from the left, the first color sub-pixels PX1 are arranged along the second direction Y, and centers of adjacent first color sub-pixels PX1 are staggered from each other in the second direction Y; and among sub-pixels in a seventh column from the left, the second color sub-pixels PX2 are arranged along the second direction Y, and centers of adjacent second color sub-pixels PX2 are staggered from each other in the second direction Y.

In a technical solution according to some embodiments of the present disclosure, as shown in FIG. 11, the first color sub-pixel PX1, the second color sub-pixel PX2 and the third color sub-pixel PX3 adjacent to each other along a third direction Z have centers staggered from each other in a third direction Z1, and third direction Z1 intersects the first direction X and intersects the second direction Y.

For example, each of the first color sub-pixel PX1, the second color sub-pixel PX2, and the third color sub-pixel PX3 can be in a shape of a square or a rounded square, and extension directions of two diagonal lines of the square are respectively parallel to the first direction X and the second direction Y. Then, an included angle between the third direction Z1 and the first direction X can be 45°, and an included angle between the third direction Z1 and the second direction Y can also be 45°.

In an implementation manner corresponding to a technical solution of the present disclosure, although the centers of the first color sub-pixel PX1, the second color sub-pixel PX2, and the third color sub-pixel PX3 that are adjacent to each other along the third direction Z are staggered from each other in the third direction Z1, the first color sub-pixel PX1 and the second color sub-pixel PX2 adjacent to each other along the third direction Z1 overlap with each other in the third direction Z1, and the third color sub-pixel PX3 and the second color sub-pixel PX2 adjacent to each other along the third direction Z1 overlap with each other in the third direction Z1.

In some embodiments of the present disclosure, the first color sub-pixel PX1 is a green sub-pixel and have a width W1 along a fourth direction Z2, the second color sub-pixel PX2 is a red sub-pixel and have a width W2 along the fourth direction Z2, and the third color sub-pixel PX3 is a blue sub-pixel and have a width W3 along the fourth direction Z2. The fourth direction Z2 is perpendicular to the third direction Z1. An overlapping part between the first color sub-pixel PX1 and the second color sub-pixel PX2 adjacent to each other along the third direction Z1 have a width W3 along the fourth direction, and an overlapping part between the third color sub-pixel PX3 and the second color sub-pixel PX2 adjacent to each other along the third direction Z1 have a width W4 along the fourth direction Z2, where $0.5 \leq (W3/W1) \leq 1$ and $0.5 \leq (W4/W2) \leq 1$.

In some technical solutions of the present disclosure, as shown in FIG. 12 to FIG. 15, centers of two first color sub-pixels PX1 adjacent to each other along the second direction Y and centers of two second color sub-pixels PX2 respectively adjacent to the two first color sub-pixels PX1 along the first direction X are four vertices of a virtual parallelogram P1. That is, four lines connecting centers of two first color sub-pixels PX1 adjacent to each other along the second direction Y and centers of two second color sub-pixels PX2 respectively adjacent to the two first color sub-pixels PX1 along the first direction X form a virtual parallelogram P1.

The centers of two first color sub-pixels PX1 adjacent to each other along the second direction Y can be slightly staggered from each other in the second direction Y, or the centers of the first color sub-pixel PX1 and the second color sub-pixel PX2 adjacent to each other along the first direction X can be slightly staggered from each other in the first direction X. Then, as shown in FIG. 12 and FIG. 14, the virtual parallelogram P1 can be a parallelogram not including a right angle.

In some technical solutions of the present disclosure, as shown in FIG. 12 to FIG. 15, centers of two second color sub-pixels PX2 adjacent to each other along the second direction Y and centers of two third color sub-pixels PX3 respectively adjacent to the two second color sub-pixels PX2 along the first direction X are four vertices of a virtual parallelogram P2. That is, four lines connecting centers of two second color sub-pixels PX2 adjacent to each other along the second direction Y and centers of two third color sub-pixels PX3 respectively adjacent to the two second color sub-pixels PX2 along the first direction X are four vertices of a virtual parallelogram P2 form a virtual parallelogram P2.

The centers of two second color sub-pixels PX2 adjacent to each other along the second direction Y can be slightly staggered from each other in the second direction Y, or the centers of the second color sub-pixel PX2 and the third color sub-pixel PX3 adjacent to each other along the first direction X can be slightly staggered from each other in the first direction X. Then, as shown in FIG. 12 and FIG. 14, the virtual parallelogram P2 can be a parallelogram not including a right angle.

In some technical solutions of the present disclosure, as shown in FIG. 12 to FIG. 15, centers of two third color sub-pixels PX3 adjacent to each other along the second direction Y and centers of two first color sub-pixels PX1 respectively adjacent to the two third color sub-pixels PX3 along the first direction X are four vertices of a virtual parallelogram P3. That is, four lines connecting the centers of two third color sub-pixels PX3 adjacent to each other along the second direction Y and the centers of two first color sub-pixels PX1 respectively adjacent to the two third color sub-pixels PX3 along the first direction X form a virtual parallelogram P3.

The centers of two third color sub-pixels PX3 adjacent to each other along the second direction Y can be slightly staggered from each other in the second direction Y, or the centers of the third color sub-pixel PX3 and the first color sub-pixel PX1 that are adjacent to each other along the first direction X can be slightly staggered from each other in the first direction X. Then, as shown in FIG. 12 and FIG. 14, the virtual parallelogram P3 can be a parallelogram not including a right angle.

In a technical solution according to some embodiments of the present disclosure, as shown in FIG. 12 and FIG. 14, each of the virtual parallelogram P1, the virtual parallelogram P2 and the virtual parallelogram P3 is a parallelogram not including a right angle. Then, centers of sub-pixels of a same color arranged along the second direction Y are staggered from each other in the second direction Y, and/or centers of sub-pixels of a same color arranged along the first direction X are staggered from each other in the first direction X, thereby avoiding a color fringing phenomenon at an edge of the display panel.

In a technical solution according to some embodiments of the present disclosure, as shown in FIG. 13 and FIG. 15, at least one of the virtual parallelogram P1, the virtual parallelogram P2, and the virtual parallelogram P3 is a parallelogram not including a right angle, and another at least one of the virtual parallelogram P1, the virtual parallelogram P2, and the virtual parallelogram P3 is a parallelogram including a right angle. For example, as shown in FIG. 15, the virtual parallelogram P1 is a parallelogram not including a right angle, and each of the virtual parallelogram P2 and the virtual parallelogram P3 is a parallelogram including a right angle.

In some technical solutions of the present disclosure, as shown in FIG. 11, centers of two first color sub-pixels PX1 adjacent to each other along the second direction Y and centers of two second color sub-pixels PX1 respectively adjacent to the two first color sub-pixels PX1 along the first direction X are four vertices of a virtual rectangle R1. That is, four lines connecting the centers of two first color sub-pixels PX1 adjacent to each other along the second direction Y and the centers of two second color sub-pixels PX1 respectively adjacent to the two first color sub-pixels PX1 along the first direction X form a virtual rectangle R1.

In some technical solutions of the present disclosure, as shown in FIG. 11, centers of two second color sub-pixels PX2 adjacent to each other along the second direction Y and centers of two third color sub-pixels PX3 respectively adjacent to the two second color sub-pixels PX2 along the first direction X are four vertices of a virtual rectangle R2. That is, four lines connecting the centers of two second color sub-pixels PX2 adjacent to each other along the second direction Y and the centers of two third color sub-pixels PX3 respectively adjacent to the two second color sub-pixels PX2 along the first direction X form a virtual rectangle R2.

In some technical solutions of the present disclosure, as shown in FIG. 11, centers of two third color sub-pixels PX3 adjacent to each other along the second direction Y and centers of two first color sub-pixels PX1 respectively adjacent to the two third color sub-pixels PX3 along the first direction X are four vertices of a virtual rectangle R3. That is, four lines connecting the centers of two third color sub-pixels PX3 adjacent to each other along the second direction Y and the centers of two first color sub-pixels PX1 respectively adjacent to the two third color sub-pixels PX3 along the first direction X form a virtual rectangle R3.

In a technical solution according to some embodiments of the present disclosure, as shown in FIG. 11, each of the virtual parallelogram P1, the virtual parallelogram P2, and the virtual parallelogram P3 is a virtual rectangle. That is, the virtual parallelogram P1 is a virtual rectangle R1, the virtual parallelogram P2 is a virtual rectangle R2, and the virtual parallelogram P3 is a virtual rectangle R3.

In a technical solution according to some embodiments of the present disclosure, as shown in FIG. 13 and FIG. 15, at least one of the virtual parallelogram P1, the virtual parallelogram P2, and the virtual parallelogram P3 is a parallelogram not including a right angle, and another at least one of the virtual parallelogram P1, the virtual parallelogram P2, and the virtual parallelogram P3 is a virtual rectangle. For example, as shown in FIG. 15, the virtual parallelogram P1 is a parallelogram not including a right angle, the virtual parallelogram P2 is virtual rectangle R2, and the virtual parallelogram P3 is a virtual rectangle R3.

Figure 16:
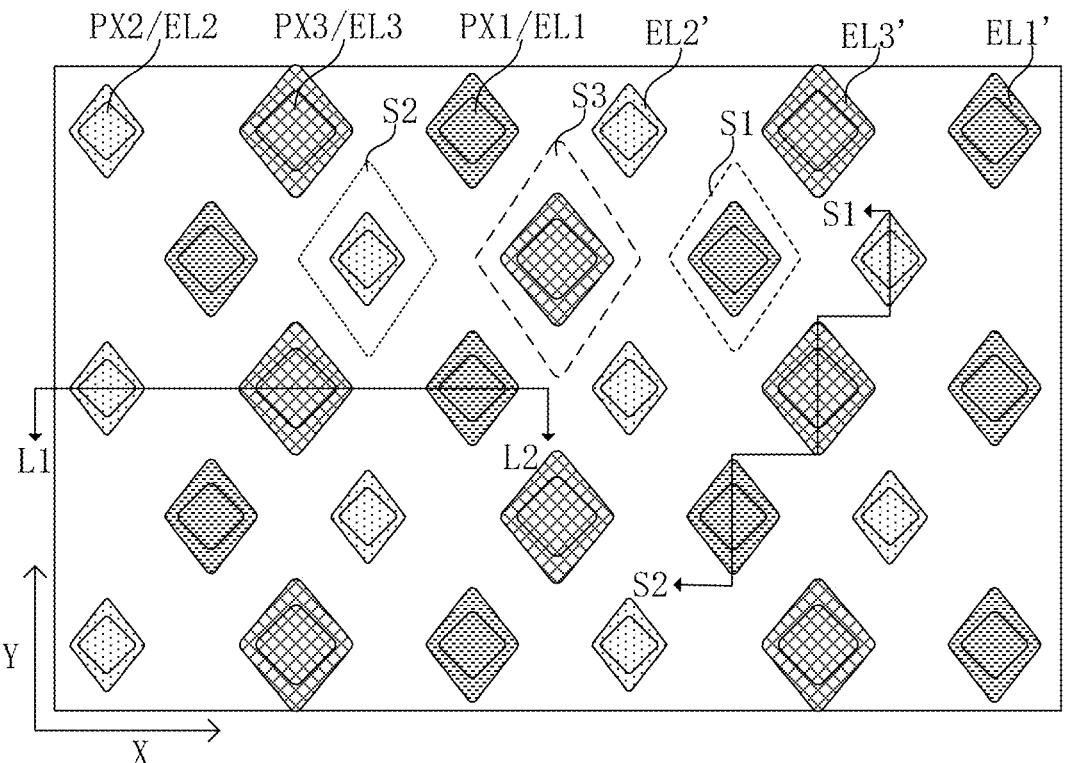
FIG. 16 is a schematic diagram illustrating preparation of a display panel according to some embodiments of the present disclosure.

FIG. 16 is a schematic diagram illustrating formation of a display panel according to some embodiments of the present disclosure.

In some embodiments of the present disclosure, when the first color sub-pixel PX1, the second color sub-pixel PX2, and the third color sub-pixel PX3 are arranged in sequence along the first direction X, and the first color sub-pixels PX1, the second color sub-pixels PX2, and the third color sub-pixels PX3 are arranged in sequence along the first direction X, as shown in FIG. 16, a width of the first safe region S1 along the second direction Y is greater than a width of the first safe region S1 along the first direction X, a width of the second safe region S2 along the second direction Y is greater than a width of the second safe region S2 along the first direction X, and a width of the third safe region S3 along the second direction Y is greater than a width of the third safe region S3 along the first direction X. That is, when the first color sub-pixel PX1, the second color sub-pixel PX2, and the third color sub-pixel PX3 are arranged in sequence along the first direction X, and the first color sub-pixels PX1, the second color sub-pixels PX2, and the third color sub-pixels PX3 are arranged in sequence along the first direction X, a width of the safe region surrounding each sub-pixel along the second direction Y is greater a width of the safe region surrounding the sub-pixel along the first direction X.

Figure 17:
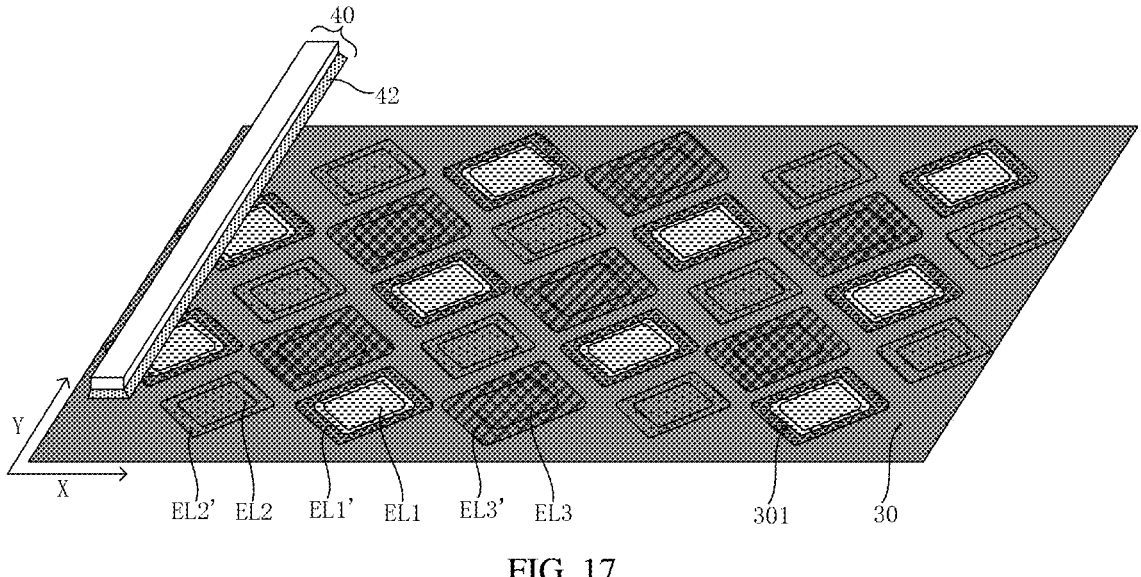
FIG. 17 is a partial schematic diagram of a display panel according to some embodiments of the present disclosure.

FIG. 17 is a partial schematic diagram of a display panel according to some embodiments of the present disclosure.

As shown in FIG. 17, in order to increase an evaporation efficiency of the light-emitting material on the display panel 01, a crucible used in an evaporation process is usually a linear crucible 40. An outlet of the linear crucible 40 can include multiple nozzles, an angle plate 42 is provided at a periphery of the outlet of the linear crucible 40, and the angle plate 42 can control an angle at which evaporation material exits from the outlet of the linear crucible 40, thereby preventing an angle at which the evaporation material near a side wall of the linear crucible 40 exits from being too large.

However, along a length direction of the linear crucible 40, two angle plates 42 disposed at two sides of the linear crucible 40 are far away from each other, then angles of the evaporation material at a position far away from the two angle plates 42 are not limited by the two angle plates 42, and the evaporation material at the position far away from the two angle plates 42 will exit at a relatively large angle in the length direction of the linear crucible 40. Along a width direction of the linear crucible 40, the angle plates 42 disposed at two sides of the linear crucible 40 is close to each other, and a phenomenon that the evaporation material exits at a relatively large angle in the width direction of the linear crucible 40 is not obvious As shown in FIG. 17, when preparing the light-emitting material layer by using the linear crucible 40, the length direction of the linear crucible 40 can be parallel to the second direction Y, and a movement direction of the linear crucible 40 can be parallel to the first direction X.

When the length direction of the linear crucible 40 is parallel to the second direction Y, a large amount of light-emitting material will exits at a relatively large angle in the first direction X; and when the movement direction of the linear crucible 40 is parallel to the first direction X, a small amount of light-emitting material will exit at a relatively large angle in the first direction X due to the angle plate 42.

In the embodiments of the present disclosure, the width of each safe region along the second direction Y is greater, which can avoid color-cross between the sub-pixels of different colors.

In the display panel according to some embodiments of the present disclosure, the first color sub-pixels PX1, the second color sub-pixels PX2, and the third color sub-pixels PX3 are alternately arranged along the first direction X, and the first color sub-pixels PX1 are adjacent to each other along the second direction Y, the second color sub-pixels PX2 are adjacent to each other along the second direction Y, and the third color sub-pixels PX3 are arranged adjacent to each other along the second direction Y. For example, as shown in FIG. 16 and FIG. 17, in a same sub-pixel row, the first color sub-pixels PX1, the second color sub-pixels PX2, and the third color sub-pixels PX3 are arranged alternately. In a same sub-pixel column, the first color sub-pixels PX1 are adjacent to each other, or the second color sub-pixels PX2 are adjacent to each other, or the third color sub-pixels PX3 are adjacent to each other.

In the display panel according to some embodiments of the present disclosure, one pixel includes a first color sub-pixel PX1, a second color sub-pixel PX2, and a third color sub-pixel PX3 that are adjacent to each other. For example, as described in an embodiment corresponding to FIG. 11, each of the first pixel PXa and the second pixel PXb includes a first color sub-pixel PX1, a second color sub-pixel PX2, and a third color sub-pixel PX3 that are arranged in a shape of a Chinese character "aa". Each pixel includes three driving circuits for driving three sub-pixels, and a unit formed by the three driving circuits have a same length in the X direction and in the Y direction.

In an arrangement of pixels in the display panel according to some embodiments of the present disclosure, if the length direction of the linear crucible 40 is parallel to the first direction X when evaporating the light-emitting material, since a distance between sub-pixels of different colors arranged along the first direction X is smaller than a distance between sub-pixels arranged along the second direction Y, a risk of color-cross between sub-pixels of different colors is greater; and if the length direction of the linear crucible 40 is parallel to the second direction Y when evaporating the light-emitting material, the risk of color-cross can be reduced.

FIG. 17 merely shows that the first color light-emitting material layer EL1 is prepared by using the linear crucible and the mask plate 30, and the second color light-emitting material layer EL2 and the third color light-emitting material layer EL3 are also prepared in a same manner as the first color light-emitting material layer EL1.

In combination with FIG. 17 and FIG. 16, when the linear crucible 40 is used to prepare the light-emitting material layer, since a large amount of light-emitting material exits at a relatively large angle in the second direction Y and a small amount of light-emitting material exits at a relatively large angle in the first direction X, a width of the shadow layer of the light-emitting material in the second direction Y is relatively large and a width of the shadow layer of the light-emitting material in the first direction X is relatively small.

Figure 18:
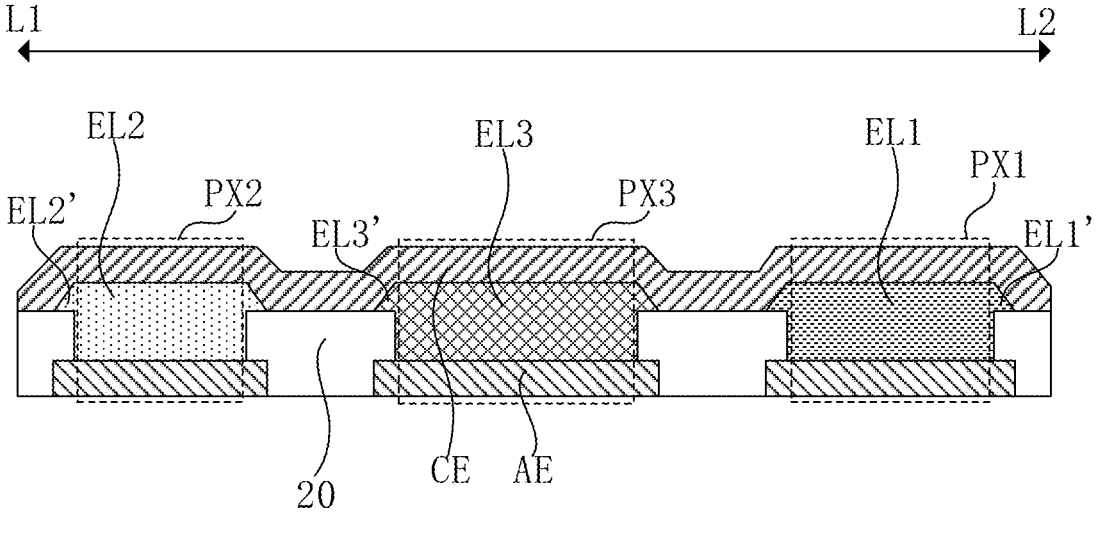
FIG. 18 is a cross-sectional view along L1-L2 shown in FIG. 17 according to an embodiment of the present disclosure.
Figure 19:
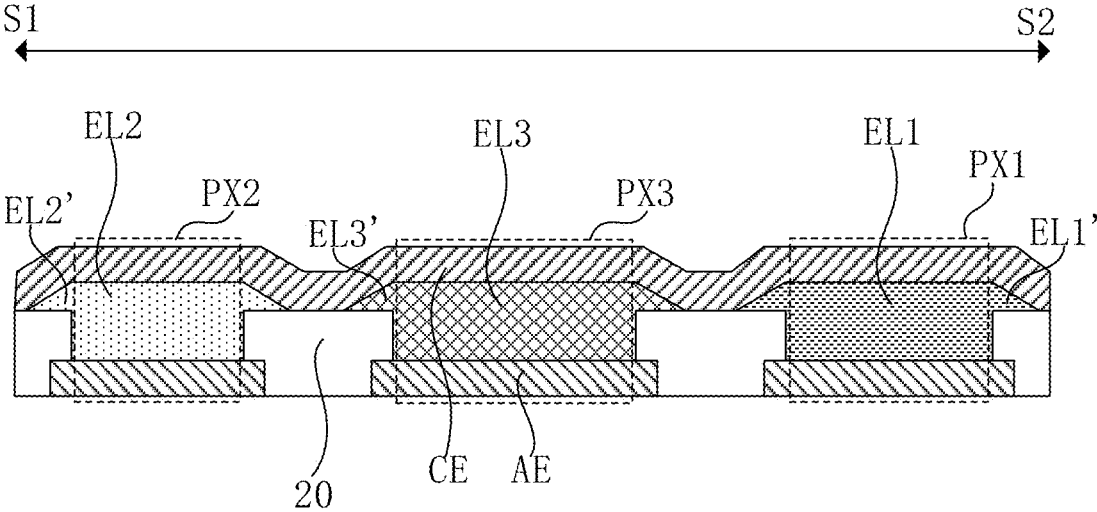
FIG. 19 is a cross-sectional view along S1-S2 shown in FIG. 17 according to an embodiment of the present disclosure.

FIG. 18 is a cross-sectional view along line L1-L2 shown in FIG. 17. FIG. 19 is a cross-sectional view along line S1-S2 shown in FIG. 17.

In combination with FIG. 16 with FIG. 18 and FIG. 19, the first color sub-pixel PX1 includes a first color light-emitting material layer EL1, and a first color shadow layer EL1' is provided in the first safe region S1. The first color shadow layer EL1' surrounds the first color light-emitting material layer EL and is connected to the first color light-emitting material layer EL at a same layer.

The first color light-emitting material layer EL1 and the first color shadow layer EL1' are different structures obtained by using a same material in a same process. The first color light-emitting material layer EL1 is provided in an opening of the pixel definition layer PDL and configured to emit light. The first color shadow layer EL1' is a part formed at a periphery of the pixel definition layer PDL when the first color light-emitting material layer EL1 is formed, and the first color shadow layer EL1' is provided in the first safe region S1 and does not exceed the first safe region S1.

In combination with FIG. 16 with FIG. 18 and FIG. 19, the second color sub-pixel PX2 includes a second color light-emitting material layer EL2, and a second color shadow layer EL2' is provided in the second safe region S2. The second color shadow layer EL2' surrounds the second color light-emitting material layer EL2 and is connected to the second color light-emitting material layer EL2 at a same layer.

The second color light-emitting material layer EL2 and the second color shadow layer EL2' are different structures obtained by using a same material in a same process. The second color light-emitting material layer EL2 is provided in an opening of the pixel definition layer PDL and configured to emit light. The second color shadow layer EL2' is a part formed at a periphery of the pixel definition layer PDL when the second color light-emitting material layer EL2 is formed, and the second color shadow layer EL2' is provided within the second safe region S2 and does not exceed the second safe region S2.

In combination with FIG. 16 with FIG. 18 and FIG. 19, the third color sub-pixel PX3 includes a third color light-emitting material layer EL3, and a third color shadow layer EL3' is provided in the third safe region S3. The third color shadow layer EL3' surrounds the third color light-emitting material layer EL3 and is connected to the third color light-emitting material layer EL3 at a same layer.

The third color light-emitting material layer EL3 and the third color shadow layer EL3' are different structures obtained by using a same material in a same process. The third color light-emitting material layer EL3 is provided in an opening of the pixel definition layer PDL and configured to emit light. The third color shadow layer EL3' is a part formed at a periphery of the pixel definition layer PDL when the third color light-emitting material layer EL3 is formed, and the third color shadow layer EL3' is provided in the third safe region S3 and does not exceed the third safe region S3.

In combination with FIG. 16 with FIG. 18 and FIG. 19, a width of the first color shadow layer EL1' along the second direction Y is greater than a width of the first color shadow layer EL1' along the first direction X, a width of the second color shadow layer EL2' along the second direction Y is greater than a width of the second color shadow layer EL2' along the first direction X, and a width of the third color shadow layer EL3' along the second direction Y is greater than a width of the third color shadow layer EL3' along the first direction X.

In some embodiments of the present disclosure, a width of the first safe region S1 along the second direction Y is within a range from 23 μm to 29 μm, a width of the second safe region S2 along the second direction Y is within a range from 23 μm to 29 μm, and a width of the third safe region S3 along the second direction Y is within a range from 23 μm to 29 μm. A width of the first safe region S1 along the first direction X is within a range from 21 μm to 28 μm; a width of the second safe region S2 along the first direction X is within a range from 21 μm to 28 μm; and a width of the third safe region S3 along the first direction X is within a range from 21 μm to 28 μm.

In some embodiments of the present disclosure, as shown in FIG. 2, FIG. 8 and FIG. 10, the width of the first safe region S1 along the second direction Y is equal to the width of the first safe region S1 along the first direction X, the width of the second safe region S2 along the second direction Y is equal to the width of the second safe region S2 along the first direction X, and the width of the third safe region S3 along the second direction Y is equal to the width of the third safe region S3 along the first direction X.

In a technical solution according to some embodiments of the present disclosure, the safe regions surrounding all sub-pixels have a same width in each direction.

Figure 20:
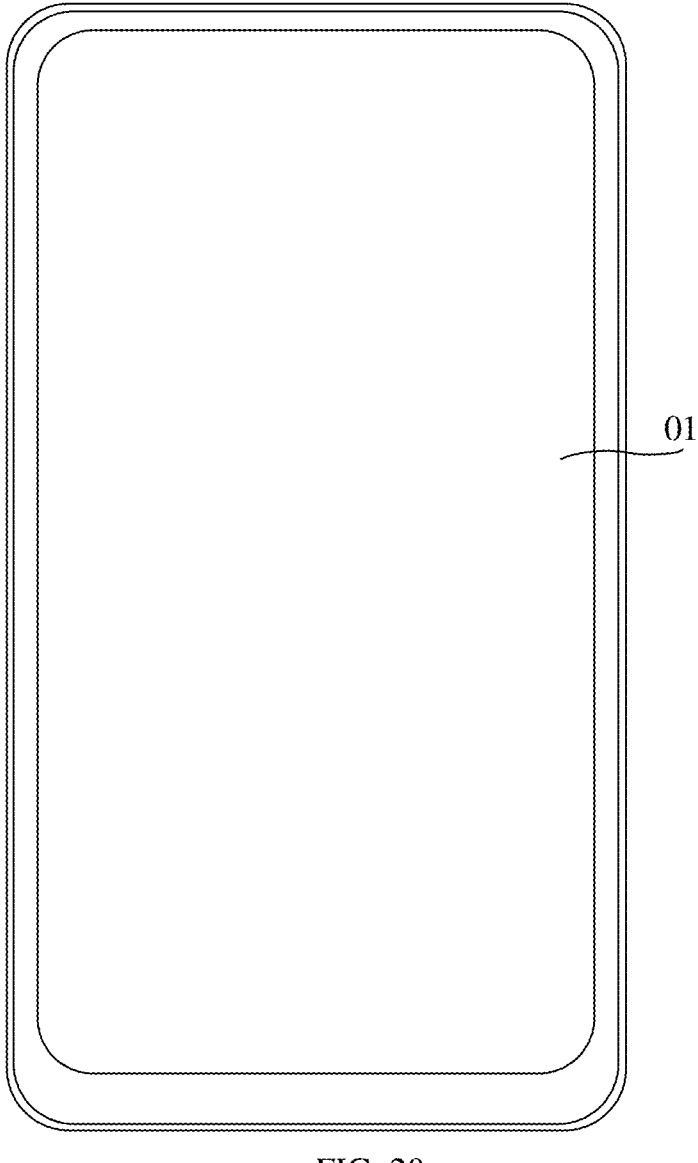
FIG. 20 is a schematic diagram of a display device according to some embodiments of the present disclosure.

FIG. 20 is a schematic diagram of a display device according to some embodiments of the present disclosure.

The embodiments of the present disclosure further provide a display device. As shown in FIG. 20, the display device includes the display panel 01 according to any one of the foregoing embodiments. The display device according to the embodiments of the present disclosure can be a mobile phone. The display device according to the embodiments of the present disclosure can also be a display device such as a computer or a television.

In the technical solution according to the embodiments of the present disclosure, the safe regions surrounding the sub-pixels of different colors have different areas. That is, for a sub-pixel of a certain color, a region in which a sub-pixel of a different color from the sub-pixel of the certain color is not provided has a respective area, and the respective areas of these regions are different from each other. In this way, an area of the safe region can be provided according to a risk of color-cross between each color sub-pixel and its adjacent sub-pixel. In this way, on the one hand, the display effect of display device can be guaranteed; and on the other hand, each safe region does not occupy an excessive large area under a premise of achieving its respective function, so as to guarantee the resolution of the display device.

The above-described embodiments are merely some embodiments of the present disclosure and are not intended to limit the present disclosure. Any modifications, equivalent substitutions, and improvements made within the present disclosure shall fall into the protection scope of the present disclosure.

What is claimed is:

1. A display panel, comprising:
first color sub-pixels, one of which is surrounded by one first safe region of first safe regions;
second color sub-pixels, one of which is surrounded by one second safe region of second safe regions; and
third color sub-pixels, one of which is surrounded by one third safe region of third safe regions, wherein none of the first color sub-pixels, the second color sub-pixels, and the third color sub-pixels are provided in each of the first safe regions, the second safe regions and the third safe regions,
wherein the first safe region, the second safe region, and the third safe region have three different areas, respectively, and
wherein each of the first safe region, the second safe region, and the third safe region is a region surrounding a corresponding sub-pixel, and an outer contour of each safe region is determined by an outer edge of a shadow layer of a light-emitting material of the corresponding sub-pixel and an alignment tolerance of a mask plate used to form the light-emitting material, such that the shadow layer is entirely contained within the corresponding safe region.

2. The display panel according to claim 1, wherein one of the third color sub-pixels has a light-emitting area larger than a light-emitting area of one of the first color sub-pixels and larger than a light-emitting area of one of the second color sub-pixels, and
wherein the area of the third safe region is larger than the area of the first safe region and larger than the area of the second safe region.

3. The display panel according to claim 2, wherein along a first direction, one of the first color sub-pixels, one of the second color sub-pixels and one of the third color sub-pixels are arranged in sequence, and at least two first color sub-pixels of the first color sub-pixels, at least two second color sub-pixels of the second color sub-pixels, and at least two third color sub-pixels of the third color sub-pixels are arranged alternately,
wherein along the first direction, a distance between one first color sub-pixel of the first color sub-pixels and one third color sub-pixel of the third color sub-pixels adjacent to the one first color sub-pixel is greater than a distance between the one first color sub-pixel and one second color sub-pixel of the second color sub-pixels adjacent to the one first color sub-pixel,
wherein along the first direction, a distance between one of the second color sub-pixels and one of the third color sub-pixels adjacent to the one of the second color sub-pixels is greater than a distance between the one of the second color sub-pixels and one of the first color sub-pixels adjacent to the one of the second color sub-pixels, and
the third color sub-pixels are blue sub-pixels.

4. The display panel according to claim 1, wherein one of the first color sub-pixels comprises a first color light-emitting material layer, one of the second color sub-pixels comprises a second color light-emitting material layer, and one of the third color sub-pixels comprises a third color light-emitting material layer,
wherein the second color light-emitting material layer has a thickness greater than a thickness of the first color light-emitting material layer and greater than a thickness of the third color light-emitting material layer, and
wherein the area of the second safe region is larger than the area of the first safe region.

5. The display panel according to claim 4, wherein along a first direction, one of the first color sub-pixels, one of the second color sub-pixels and one of the third color sub-pixels are arranged in sequence, and at least two first color sub-pixels of the first color sub-pixels, at least two second color sub-pixels of the second color sub-pixels and at least two second color sub-pixels of the third color sub-pixels are arranged alternately, and wherein a distance between one third color sub-pixel of the third color sub-pixels and one second color sub-pixel of the second color sub-pixels adjacent to the one third color sub-pixel is larger than a distance between the one third color sub-pixel and one first color sub-pixel of the first color sub-pixels adjacent to the one third color sub-pixel.

6. The display panel according to claim 4, wherein the second color sub-pixels are red sub-pixels.

7. The display panel according to claim 1, wherein at least two of the first color sub-pixels, at least two of the second color sub-pixels and at least two of the third color sub-pixels are periodically arranged in a first minimum repeat unit, wherein the first minimum repeat unit indicates arranging one first pixel of first pixels to be adjacent to one second pixel of second pixels along a first direction, wherein each of the first pixel and the second pixel comprises one of the second color sub-pixels and one of the third color sub-pixels that is adjacent to the one of the second color sub-pixels along the first direction, and one of the first color sub-pixels;

wherein in each of the first pixel and the second pixel, the one of the first color sub-pixels overlaps with the one of the second color sub-pixels and overlaps with the one of the third color sub-pixels along a second direction perpendicular to the first direction, and wherein for the first pixel and the second pixel adjacent to the first pixel along the first direction, the one of the first color sub-pixels in the first pixel is adjacent to the one of the second color sub-pixels or the one of the third color sub-pixels in the second pixel, and the one of the first color sub-pixels in the second pixel is adjacent to the one of the second color sub-pixels or the one of the third color sub-pixels in the first pixel.

8. The display panel according to claim 7, wherein at least two of the first pixels are adjacent to each other along the second direction, and at least two of the second pixels are adjacent to each other along the second direction.

9. The display panel according to claim 8, wherein a width of the first safe region along the first direction is greater than a width of the first safe region along the second direction, a width of the second safe region along the first direction is greater than a width of the second safe region along the second direction, and a width of the third safe region along the first direction is greater than a width of the third safe region along the second direction.

10. The display panel according to claim 9, wherein each of the width of the first safe region along the first direction, the width of the second safe region along the first direction and the width of the third safe region along the first direction is within a range from 23 μm to 29 μm, and each of the width of the first safe region along the second direction, the width of the second safe region along the second direction and the width of the third safe region along the second direction is within a range from 21 μm to 28 μm.

11. The display panel according to claim 10, wherein one of the first color sub-pixels comprises a first color light-emitting material layer, and a first color shadow layer is provided in the first safe region, wherein the first color shadow layer surrounds the first color light-emitting material layer and is connected to and located in a same layer as the first color light-emitting material layer, wherein one of the second color sub-pixels comprises a second color light-emitting material layer, and a second color shadow layer is provided in the second safe region, wherein the second color shadow layer surrounds the second color light-emitting material layer and is connected to and located in a same layer as the second color light-emitting material layer, wherein one of the third color sub-pixels comprises a third color light-emitting material layer, and a third color shadow layer is provided in the third safe region, wherein the third color shadow layer surrounds the third color light-emitting material layer and is connected to and located in a same layer as the third color light-emitting material layer, and wherein a width of the first color shadow layer along the first direction is greater than a width of the first color shadow layer along the second direction, a width of the second color shadow layer along the first direction is greater than a width of the second color shadow layer along the second direction, and a width of the third color shadow layer along the first direction is greater than a width of the third color shadow layer along the second direction.

12. The display panel according to claim 8, wherein two centers of two first color sub-pixels, adjacent to each other along the second direction, of the first color sub-pixels, and two centers of two second color sub-pixels, respectively adjacent to the two first color sub-pixels along the first direction, of the second color sub-pixels are four vertices of a virtual parallelogram, and/or, wherein two centers of two second color sub-pixels, adjacent to each other along the second direction, of the second color sub-pixels, and two centers of two third color sub-pixels, respectively adjacent to the two second color sub-pixels along the first direction, of the third color sub-pixels are four vertices of a virtual parallelogram, and/or, wherein two centers of two third color sub-pixels, adjacent to each other along the second direction, of the third color sub-pixels, and two centers of two first color sub-pixels, respectively adjacent to the third second color sub-pixels along the first direction, of the first color sub-pixels are four vertices of a virtual parallelogram.

13. The display panel according to claim 8, wherein two centers of two first color sub-pixels, adjacent to each other along the second direction, of the first color sub-pixels, and two centers of two second color sub-pixels, respectively adjacent to the two first color sub-pixels along the first direction, of the second color sub-pixels are four vertices of a virtual rectangle, and/or, wherein two centers of two second color sub-pixels, adjacent to each other along the second direction, of the second color sub-pixels, and two centers of two third color sub-pixels, respectively adjacent to the two second color sub-pixels along the first direction, of the third color sub-pixels are four vertices of a virtual rectangle, and/or, wherein two centers of two third color sub-pixels, adjacent to each other along the second direction, of the third color sub-pixels, and two centers of two first color sub-pixels, respectively adjacent to the third second color sub-pixels along the first direction, of the first color sub-pixels are four vertices of a virtual rectangle.

14. The display panel according to claim 7, wherein centers of at least two of the first color sub-pixels arranged along the first direction are aligned with each other in the first direction, and/or, wherein centers of at least two of the second color sub-pixels arranged along the first direction are aligned with each other in the first direction, and/or, wherein centers of at least two of the third color sub-pixels arranged along the first direction are aligned with each other in the first direction.

15. The display panel according to claim 7, wherein, in each of the first pixel and the second pixel, along the second direction, a midpoint between the one of the second color sub-pixels and the one of the third color sub-pixels overlaps with the one of the first color sub-pixels, which is a green sub-pixel.

16. The display panel according to claim 15, wherein in each of the first pixel and the second pixel, along the second direction, the midpoint between the one of the second color sub-pixels and the one of the third color sub-pixels staggers a center of the one of the first color sub-pixels.

17. The display panel according to claim 7, wherein centers of at least two of the first color sub-pixels arranged along the second direction are aligned with each other, and/or, wherein centers of at least two of the second color sub-pixels arranged along the second direction are aligned with each other, and/or, wherein centers of at least two of the third color sub-pixels arranged along the second direction are aligned with each other.

18. The display panel according to claim 7, wherein one first color sub-pixel of the first color sub-pixels, one second color sub-pixel of the second color sub-pixels and one third color sub-pixel of the third color sub-pixels are adjacent to each other along a third direction intersecting the first direction and intersecting the second direction, and centers of the one first color sub-pixel, the one second color sub-pixel and the one third color sub-pixel that are adjacent to each other along the third direction are staggered from each other in the third direction.

19. The display panel according to claim 18, wherein a width of one of the first color sub-pixels along a fourth direction is W1, and a width of one of the third color sub-pixels along the fourth direction is W2; wherein a fourth direction is perpendicular to the third direction; and wherein the first color sub-pixels are green sub-pixels, the second color sub-pixels are red sub-pixels, and the third color sub-pixels are blue sub-pixels, wherein one first color sub-pixel of the first color sub-pixels and one second color sub-pixel of the second color sub-pixels are adjacent to each other and overlap with each other along the third direction, and an overlapping part between the one first color sub-pixel and the one second color sub-pixel has a width W3 along the fourth direction, wherein one third color sub-pixel of the third color sub-pixels and one second color sub-pixel of the second color sub-pixels are adjacent to each other and overlap with each other along the third direction, and an overlapping part between the one third color sub-pixel and the one second color sub-pixel has a width W4 along the fourth direction, and wherein $0.5 \leq (W3/W1) \leq 1$, and $0.5 \leq (W4/W2) \leq 1$.

20. A display device, comprising a display panel, wherein the display panel comprises:

first color sub-pixels, one of which is surrounded by one first safe region of first safe regions;

second color sub-pixels, one of which is surrounded by one second safe region of second safe regions; and third color sub-pixels, one of which is surrounded by one third safe region of third safe regions, wherein none of the first color sub-pixels, the second color sub-pixels, and the third color sub-pixels are provided in each of the first safe regions, the second safe regions, and the third safe regions, wherein the first safe region, the second safe region, and the third safe region have three different areas, respectively, and wherein each of the first safe region, the second safe region, and the third safe region is a region surrounding a corresponding sub-pixel, and an outer contour of each safe region is determined by an outer edge of a shadow layer of a light-emitting material of the corresponding sub-pixel and an alignment tolerance of a mask plate used to form the light-emitting material, such that the shadow layer is entirely contained within the corresponding safe region.

* * * * *